US010840362B2

(12) United States Patent
Philippou et al.

(10) Patent No.: US 10,840,362 B2
(45) Date of Patent: Nov. 17, 2020

(54) IGBT WITH DV/DT CONTROLLABILITY

(71) Applicant: Infineon Technologies AG, Neubiberg (DE)

(72) Inventors: Alexander Philippou, Munich (DE); Markus Bina, Grosshelfendorf (DE); Matteo Dainese, Villach (AT); Christian Jaeger, Munich (DE); Johannes Georg Laven, Taufkirchen (DE); Francisco Javier Santos Rodriguez, Villach (AT); Antonio Vellei, Villach (AT); Caspar Leendertz, Munich (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/168,136

(22) Filed: Oct. 23, 2018

(65) Prior Publication Data
US 2019/0123186 A1     Apr. 25, 2019

(30) Foreign Application Priority Data

Oct. 24, 2017   (DE) ........................ 10 2017 124 871

(51) Int. Cl.
*H01L 29/73*      (2006.01)
*H01L 29/739*     (2006.01)
(Continued)

(52) U.S. Cl.
CPC ...... *H01L 29/7397* (2013.01); *H01L 29/0615* (2013.01); *H01L 29/0619* (2013.01);
(Continued)

(58) Field of Classification Search
CPC combination set(s) only.
See application file for complete search history.

(56) References Cited

U.S. PATENT DOCUMENTS 6,913,977 B2    7/2005  Pattanayak
9,520,487 B2   12/2016  Hirabayashi et al.
(Continued)

FOREIGN PATENT DOCUMENTS

DE   102010036501 A1   2/2011
DE   102012201950 A1  10/2012
(Continued)

*Primary Examiner* — Moin M Rahman
(74) *Attorney, Agent, or Firm* — Murphy, Bilak & Homiller, PLLC

(57) ABSTRACT

A power semiconductor device includes an active cell region with a drift region, and IGBT cells at least partially arranged within the active cell region. Each IGBT cell includes at least one trench extending into the drift region along a vertical direction, an edge termination region surrounding the active cell region, and a transition region arranged between the active cell region and the edge termination region. The transition region has a width along a lateral direction from the active cell region towards the edge termination region. At least some of the IGBT cells are arranged within, or, respectively, extend into the transition region. An electrically floating barrier region of each IGBT cell is arranged within the active cell region and in contact with at least some of the trenches of the IGBT cells. The electrically floating barrier region does not extend into the transition region.

16 Claims, 26 Drawing Sheets

(51) Int. Cl.
  *H01L 29/06* (2006.01)
  *H01L 29/40* (2006.01)
  *H01L 29/66* (2006.01)
  *H01L 29/08* (2006.01)
  *H01L 29/10* (2006.01)
  *H01L 29/417* (2006.01)
  *H01L 29/423* (2006.01)

(52) U.S. Cl.
  CPC ...... *H01L 29/0623* (2013.01); *H01L 29/0638* (2013.01); *H01L 29/0649* (2013.01); *H01L 29/0696* (2013.01); *H01L 29/0804* (2013.01); *H01L 29/1095* (2013.01); *H01L 29/407* (2013.01); *H01L 29/41708* (2013.01); *H01L 29/66348* (2013.01); *H01L 29/7396* (2013.01); *H01L 29/4238* (2013.01)

(56) References Cited

U.S. PATENT DOCUMENTS

| | | | |
|---|---|---|---|
| 9,825,025 B2 | 11/2017 | Kumagai | |
| 2007/0114598 A1 | 5/2007 | Hotta et al. | |
| 2011/0012195 A1* | 1/2011 | Momota | H01L 29/7395 257/334 |
| 2011/0101417 A1 | 5/2011 | Ogura et al. | |
| 2011/0201187 A1 | 8/2011 | Nishiwaki et al. | |
| 2012/0292662 A1 | 11/2012 | Matsuura et al. | |
| 2012/0313139 A1 | 12/2012 | Matsuura et al. | |
| 2013/0328105 A1 | 12/2013 | Matsuura | |
| 2014/0231866 A1 | 8/2014 | Senoo et al. | |
| 2014/0374842 A1* | 12/2014 | Weber | H01L 29/404 257/409 |
| 2015/0008479 A1 | 1/2015 | Kato et al. | |
| 2015/0340480 A1 | 11/2015 | Matsuura | |
| 2015/0349103 A1 | 12/2015 | Onozawa et al. | |
| 2016/0155831 A1 | 6/2016 | Madathil | |
| 2016/0172453 A1* | 6/2016 | Hirabayashi | H01L 29/0834 257/144 |
| 2016/0336393 A1* | 11/2016 | Kim | H01L 29/0619 |
| 2016/0359026 A1 | 12/2016 | Matsuura | |
| 2016/0365413 A1 | 12/2016 | Wagner et al. | |
| 2017/0018547 A1 | 1/2017 | Naito | |
| 2017/0018637 A1 | 1/2017 | Kitamura | |
| 2017/0025522 A1 | 1/2017 | Naito | |
| 2017/0263738 A1* | 9/2017 | Soeno | H01L 29/402 |
| 2019/0067491 A1 | 2/2019 | Blanchard et al. | |
| 2019/0123186 A1 | 4/2019 | Philippou et al. | |
| 2019/0326118 A1 | 10/2019 | Naito | |

FOREIGN PATENT DOCUMENTS

| | | |
|---|---|---|
| DE | 102014109475 A1 | 1/2015 |
| DE | 102014117364 A1 | 5/2015 |
| DE | 102014226161 B4 | 10/2017 |
| EP | 2674979 A2 | 12/2013 |

* cited by examiner

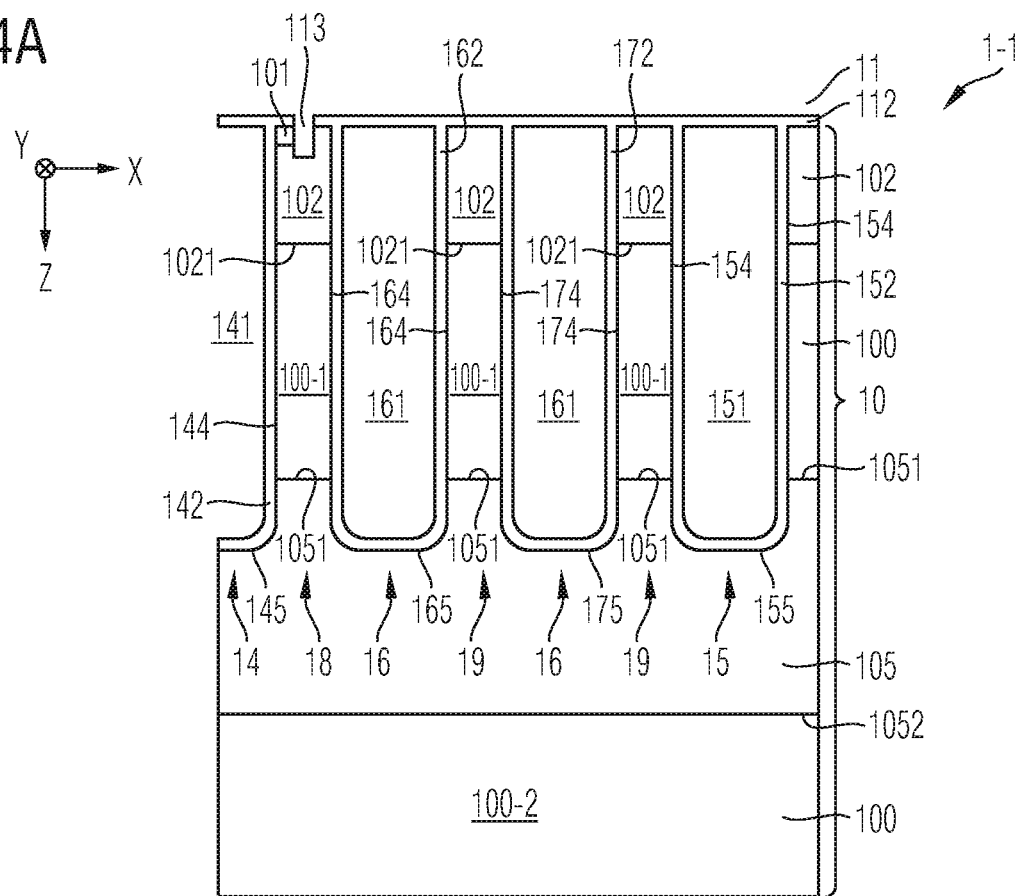

IGBT WITH DV/DT CONTROLLABILITY

TECHNICAL FIELD

This specification refers to embodiments of a power semiconductor device, such as an IGBT, and to embodiments of processing a power semiconductor device. In particular, this specifications refers to embodiments of an IGBT that has a Micro-Pattern-Trench (MPT) configuration, including dummy trenches, wherein a plurality of trenches extend into an electrically floating barrier region.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

An IGBT usually comprises a semiconductor body configured to conduct a load current along a load current path between two load terminals of the IGBT. Further, the load current path may be controlled by means of an insulated electrode, sometimes referred to as gate electrode. For example, upon receiving a corresponding control signal from, e.g., a driver unit, the control electrode may set the IGBT in one of a conducting state and a blocking state.

In some cases, the gate electrode may be included within a trench of the IGBT, wherein the trench may exhibit, e.g., a stripe configuration or a needle configuration.

Further, trenches of an IGBT may integrate different types of electrodes; some of the electrodes may be connected to the IGBT gate terminal, and others may be connected to an IGBT load terminal, e.g., the source/emitter terminal.

It is usually desirable to keep losses, e.g., switching losses, of the IGBT low. For example, low switching losses may be achieved by ensuring short switching durations, e.g., a short turn-on duration and/or a short turn-off duration.

On the other hand, in a given application, there may also be requirements regarding a maximum slope of the voltage (dV/dt) and/or a maximum slope of the load current (dI/dt).

Further, the switching behavior of an IGBT may depend on its operating temperature, wherein it can be desirable to fulfill said provisions regarding power losses and voltage/current slopes within a broad range of possible operating temperatures.

SUMMARY

According to an embodiment, a power semiconductor device comprises an active cell region with a drift region of a first conductivity type; a plurality of IGBT cells at least partially arranged within the active cell region, wherein each of the IGBT cells comprises at least one trench that extends into the drift region along a vertical direction; an edge termination region surrounding the active cell region; a transition region arranged between the active cell region and the edge termination region, the transition region having a width along a lateral direction from the active cell region towards the edge termination region, wherein at least some of the IGBT cells are arranged within, or, respectively, extend into the transition region; and an electrically floating barrier region of a second conductivity type, wherein the electrically floating barrier region is arranged within the active cell region and in contact with at least some of the trenches of the IGBT cells, and wherein the electrically floating barrier region does not extend into the transition region.

According to another embodiment, a power semiconductor device comprises a first load terminal and a second load terminal, the power semiconductor device being configured to conduct a load current along a vertical direction between said terminals and comprising: an active cell region with a drift region of a first conductivity type; an edge termination region having a well region of a second conductivity type; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode; at least one dummy trench having a dummy electrode electrically coupled to the control electrode; at least one source trench having a source electrode electrically connected with the first load terminal. The plurality of mesas include at least one active mesa arranged between the at least one control trench and the at least one source trench; and at least one inactive mesa arranged adjacent to the at least one dummy trench. The power semiconductor device further comprises an electrically floating barrier region of the second conductivity type, wherein at least both a bottom of the dummy trench and a bottom of the source trench extend at least partially into the electrically floating barrier region, and wherein a portion of the drift region located in a lateral direction between the electrically floating barrier region and the well region has a lateral extension of at least 1 μm in said lateral direction.

According to yet another embodiment, a method of processing a power semiconductor device is presented. The power semiconductor device comprises an active cell region with a drift region of a first conductivity type; a plurality of IGBT cells at least partially arranged within the active cell region, wherein each of the IGBT cells comprises at least one trench that extends into the drift region along a vertical direction; an edge termination region surrounding the active cell region; and a transition region arranged between the active cell region and the edge termination region, the transition region having a width along a lateral direction from the active cell region towards the edge termination region, wherein at least some of the IGBT cells are arranged within, or, respectively, extend into the transition region. The method comprises: providing an electrically floating barrier region of a second conductivity type, wherein the electrically floating barrier region is arranged within the active cell region and in contact with at least some of the trenches of the IGBT cells, and wherein the electrically floating barrier region does not extend into the transition region.

According to another embodiment, a further method of processing a power semiconductor device is presented. The power semiconductor device comprises a first load terminal and a second load terminal, the power semiconductor device being configured to conduct a load current along a vertical direction between said terminals and comprising: an active cell region with a drift region of a first conductivity type; an edge termination region having a well region of a second conductivity type; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode; at least one dummy trench having a dummy electrode electrically coupled to the control electrode; at least one source trench having a source electrode electrically connected with the first load terminal. The plurality of mesas include at least one active mesa arranged between the at least one control trench and the at least one source trench; and at least one inactive mesa arranged adjacent to the at least one dummy trench. The further method comprises: providing an electrically floating barrier region of the second conductivity type, wherein at least both a bottom of the dummy trench and a bottom of the source trench extend at least partially into the electrically floating barrier region, and a portion of the drift region located in a lateral direction between the electrically floating barrier region and the well region has a lateral extension of at least 1 µm in said lateral direction.

In accordance with a yet further embodiment, a power semiconductor device comprises a first load terminal and a second load terminal. The power semiconductor device is configured to conduct a load current along a vertical direction between said terminals and comprises: a drift region of a first conductivity type; a plurality of IGBT cells, wherein each of the IGBT cells comprises a plurality of trenches that extend into the drift region along the vertical direction and that laterally confine at least one active mesa, the at least one active mesa comprising an upper section of the drift region; and an electrically floating barrier region of a second conductivity type that is spatially confined, in and against the vertical direction, by the drift region. The total volume of all active mesas is divided into a first share and into a second share, the first share not laterally overlapping with the barrier region and the second share laterally overlapping with the barrier region. The first share is configured to carry the load current at least within the range of 0% to 100% of the nominal load current for which the power semiconductor device is designed. The second share is configured to carry the load current if it exceeds at least 0.5% of the nominal load current.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 2, 3A, 3B, 4A, and 4B each schematically and exemplarily illustrates a section of a vertical cross-section of a power semiconductor device in accordance with one or more embodiments;

DETAILED DESCRIPTION

Figure 1:
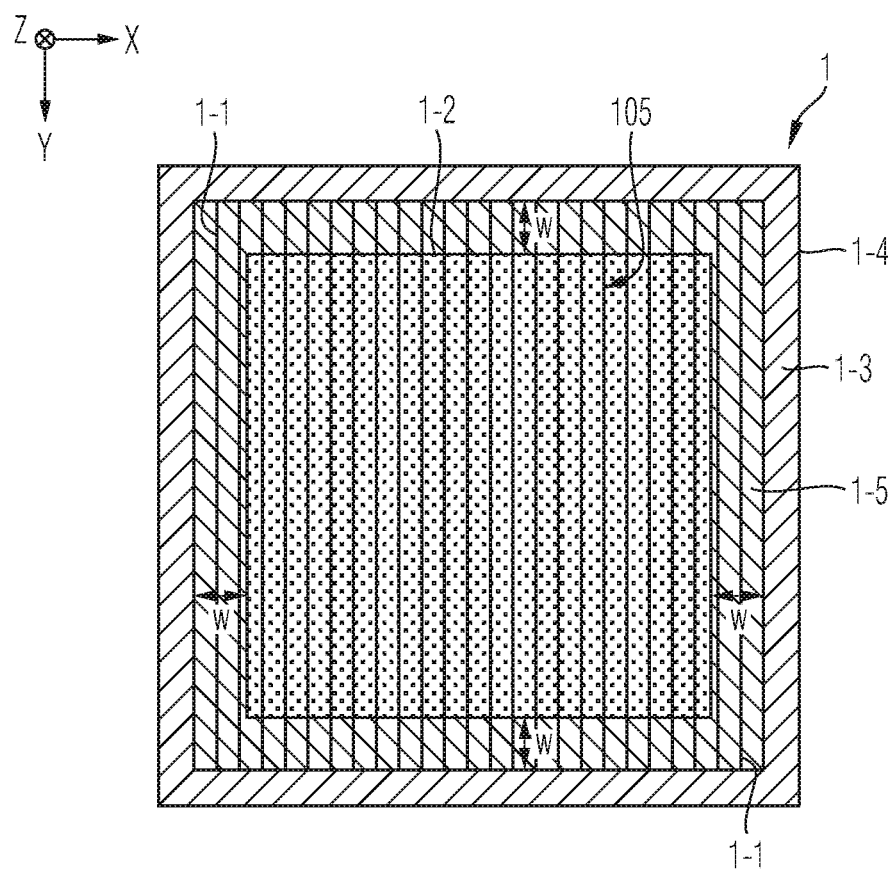
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a semiconductor device, such as an IGBT, e.g., exhibiting a stripe cell or cellular cell configuration, e.g., an IGBT that may be used within a power converter or a power supply. Thus, in an embodiment, such IGBT can be configured to carry a load current that is to be fed to a load and/or, respectively, that is provided by a power source. For example, the IGBT may comprise one or more active power semiconductor cells, such as a monolithically integrated IGBT cell, and/or a monolithically integrated RC-IGBT cell. Such transistor cells may be integrated in a power semiconductor module. A plurality of such cells may constitute a cell field that is arranged with an active cell region of the IGBT.

The term "power semiconductor device" as used in this specification intends to describe a semiconductor device on a single chip with high voltage blocking and/or high current-carrying capabilities. In other words, such power semiconductor device (e.g., an IGBT) is intended for high current, typically in the Ampere range, e.g., up to several ten or hundred Ampere, and/or high voltages, typically above 15 V, more typically 100 V and above, e.g., up to at least 1200 V.

For example, the power semiconductor device described below may be IGBT exhibiting a stripe trench cell configuration or a cellular trench cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 2:
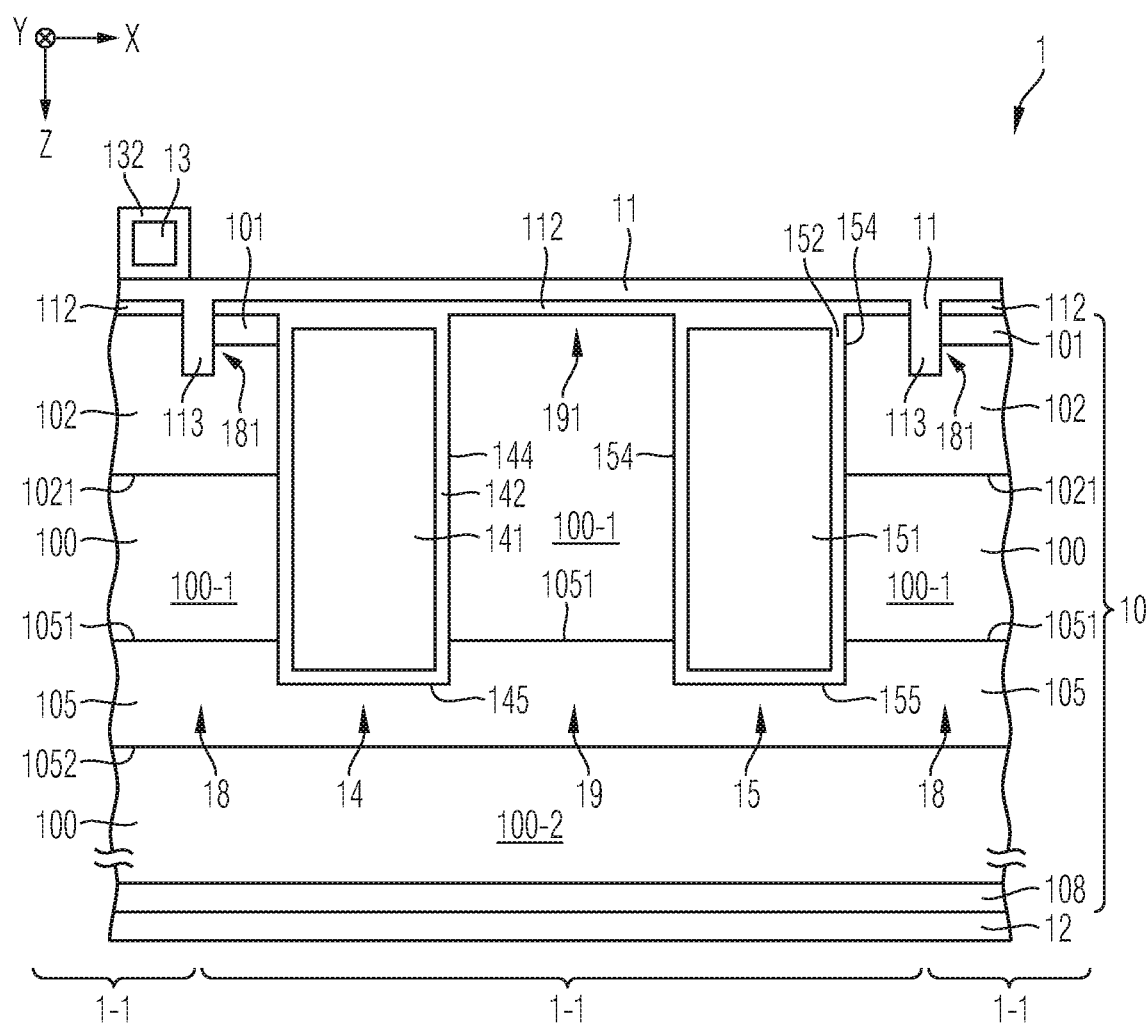

FIG. 1 schematically and exemplarily illustrates a section of a horizontal projection of a power semiconductor device 1 in accordance with one or more embodiments. FIG. 2 schematically and exemplarily illustrates a section of a vertical cross-section of a power semiconductor device 1 in accordance with one or more embodiments. In the following, it will be referred to each of FIG. 1 and FIG. 2.

The power semiconductor device 1 can be an IGBT or, respectively, a power semiconductor device that has a configuration that is based on an IGBT configuration, such as Reverse Conducting (RC) IGBT.

For example, the power semiconductor device 1 comprises a semiconductor body 10 that is coupled to a first load terminal 11 and a second load terminal 12. For example, the first load terminal 11 is an emitter terminal, whereas the second load terminal 12 can be a collector terminal.

The semiconductor body 10 may comprise a drift region 100 of the first conductivity type. The drift region 100 may be n-doped. In an embodiment, the drift region 100 has a (electrically activated) dopant concentration within the range of $2e12$ $cm^{-3}$ to $4e14$ $cm^{-3}$. For example, the extension of the drift region 100 along the vertical direction Z and its dopant concentration are chosen in dependence of the blocking voltage rating for which the power semiconductor device 1 shall be designed, as it is known to the skilled person. Within the present specification, the term "drift region" is intended to describe such region of a power semiconductor device (e.g., an IGBT) the skilled person typically designates as drift region or, respectively, drift zone.

Further, the first load terminal 11 may be arranged on the frontside of the power semiconductor device 1 and may include a frontside metallization. The second load terminal 12 may be arranged, opposite to the frontside, e.g., on a backside of the power semiconductor device 1 and may include, for example, a backside metallization. Accordingly, the power semiconductor device 1 may exhibit a vertical configuration and the load current may be conducted along the vertical direction Z. In another embodiment, each of the first load terminal 11 and the second load terminal 12 may be arranged on a common side, e.g., both on the frontside, of the power semiconductor device 1.

Now referring in more detail to FIG. 1, the power semiconductor device 1 may further include an active cell region 1-2, an edge termination region 1-3 and a chip edge 1-4. The edge termination region 1-3 may surround the active cell region 1-2. A transition region 1-5 can be arranged between the active cell region 1-2 and the edge termination region 1-3. For example, the transition region 1-5 surrounds the active cell region 1-2. The transition region 1-5 can be surrounded by the edge termination region 1-3.

In an embodiment, the semiconductor body 10 essentially consists of the edge termination region 1-3, the transition region 1-5 and the active cell region 1-2.

For example, each of the edge termination region 1-3, the transition region 1-5 and the active cell region 1-2 extend along the vertical direction Z from the frontside of the power semiconductor device 1 entirely through the semiconductor body 10 to the backside of the power semiconductor device 1. Each of the edge termination region 1-3, the transition region 1-5 and the active cell region 1-2 may not only include components of the semiconductor body 10, but also components external thereof, e.g., components of the first load terminal 11 and/or the second load terminal 12.

Further, in an example, along lateral directions, there is no overlap between the edge termination region 1-3, the transition region 1-5 and the active cell region 1-2 within the semiconductor body 10. Thus, the active cell region 1-2 may entirely be surrounded by the transition region 1-5, and, within the semiconductor body 10, there is no lateral overlap, e.g., along the first lateral direction X, the second lateral direction Y and linear combinations thereof, between the transition region 1-5 and the active cell region 1-2. Analogously, the transition region 1-5 may entirely be surrounded by the edge termination region 1-3, and, within the semiconductor body 10, there is no lateral overlap, e.g., along the first lateral direction X, the second lateral direction Y and linear combinations thereof, between the transition region 1-5 and the edge termination region 1-3.

In an embodiment, the transition region 1-5 has a width W along a lateral direction from the active cell region 1-2 towards the edge termination region 1-3 (e.g., in/against the first lateral direction X and in/against the second lateral Y and/or in linear combinations of the these lateral directions) of at least 1 µm. Said width W of the transition region 1-5 may hence be the distance between the active cell region 1-2 and the edge termination region 1-3. This (minimum) width W may be present along the entire circumference of the transition region 1-5. The width of the transition region 1-5 may be greater than 1 µm, e.g., greater than 3 µm, greater than 5 µm or even greater than 10 µm. Further exemplary features of the transition region 1-5 and the edge termination region 1-5 will be described below. Along said width W, a portion of the drift region 100 may be present.

The chip edge 1-4 may laterally terminate the semiconductor body 10, e.g., the chip edge 1-4 may have become into being by means of wafer dicing, for example, and may extend along the vertical direction Z. The edge termination region 1-3 may be arranged between the active cell region 1-2 and the chip edge 1-4, as illustrated in FIG. 1.

In the present specification, the terms "active cell region" and "edge termination region" are employed in a regular manner, i.e., the active cell region 1-2 and the edge termination region 1-3 may be configured to provide for the principle technical functionalities the skilled person typically associated therewith.

For example, the active cell region 1-2 of the power semiconductor device 1 is configured to conduct the main part of the load current between the terminals 11, 12, whereas the edge termination region 1-3 does not conduct the load current, but rather fulfills functions regarding the course of the electric field, ensuring the blocking capability, safely terminating the active cell region 1-2 and the transition region 1-5 and so forth, in accordance with an embodiment.

The power semiconductor device 1 comprises a plurality of IGBT cells 1-1, wherein the plurality of IGBT cells 1-1 is predominantly arranged within the active cell region 1-2. For example, most of the plurality of IGBT cells 1-1 of the power semiconductor device 1 are arranged within the active cell region 1-2. The number of IGBT cells 1-1 may be greater than 100, than 1000, or even greater than 10,000. For example, at least 85%, at least 95% or at least 98% of the total number of IGBT cells 1-1 are arranged within the active cell region 1-2. In an embodiment, the remaining IGBT cells 1-1 are arranged within the transition region 1-5. Some of the IGBT cells 1-1 may entirely be arranged within the transition region 1-5, others may be arranged with both within the active cell region 1-2 and extend, by means of their respective lateral ends, into the transition region, as schematically illustrated in FIG. 1.

In an embodiment, each IGBT cell 1-1 at least partially extends into the transition region 1-5, as schematically and exemplarily illustrated in FIG. 1.

Thus, for example, some of the IGBT cells 1-1 are arranged within the transition region 1-5 or, respectively, extend into the transition region 1-5, as schematically and exemplarily illustrated in FIG. 1. In this respect, the transition region 1-5 can also be understood as a form of an active region of the power semiconductor device 1. For example, by means of said share of the total number of IGBT cells 1-1 that is arranged within the transition region 1-5 or that extends into the transition region 1-5, the transition region 1-5 may also be configured to conduct a part of the load current.

In accordance with an embodiment, the IGBT cells 1-1 are not arranged within the edge termination region 1-3. However, within the edge termination region 1-3, specially configured charge carrier drainage cells (not illustrated in FIG. 1, cf. FIG. 6A-B) may be included that support drainage of charge carriers, e.g., shortly before and/or during a turn-off operation.

Each IGBT cell 1-1 may exhibit a stripe configuration as schematically illustrated in FIG. 1, wherein the total lateral extension in one lateral direction, e.g., along with the second lateral direction Y, of each IGBT cell 1-1 and its components may substantially correspond to, or, respectively, slightly exceed the total extension of the active cell region 1-2 along this lateral direction.

In another embodiment, each IGBT cell 14 may exhibit a cellular configuration, wherein the lateral extensions of each IGBT cell 1-1 may be substantially smaller than the total lateral extensions of the active cell region 1-2.

However, embodiments described herein rather relate to IGBT cells 1-1 having a stripe configuration with respect to the second lateral direction Y, as exemplarily and schematically illustrated in most of the drawings.

In an embodiment, each of the plurality of IGBT cells 1-1 that are included in the active cell region 1-2 exhibit the same set-up. A section of an exemplary IGBT cell set-up will now be described with respect to FIG. 2.

The configuration of the IGBT cells 1-1 that may be included within the transition region 1-5 can be identical to the configuration of the IGBT cells 1-1 that are included in the active cell region 1-2. Additionally or alternatively, the transition region 1-5 includes IGBT cells that have a different configuration, e.g., in terms of the MPT contacting scheme/neighborhood relation (cf. more detailed explanations below), as compared to the IGBT cells 1-1 of the active cell region 1-2.

Each IGBT cell 1-1 comprises at least one trench that extends into the drift region along the vertical direction Z. Each IGBT cell 1-1 may extend at least partially into the semiconductor body 10 and comprise at least a section of the drift region 100. Further, each IGBT cell 1-1 may be electrically connected with the first load terminal 11. Each IGBT cell 1-1 may be configured to conduct a part of the load current between said terminals 11 and 12, and to block a blocking voltage applied between said terminals 11 and 12.

For controlling the power semiconductor device 1, each IGBT cell 14 may be equipped with a control electrode 141 included in a control trench 14 and configured to selectively set the respective IGBT cell 1-1 into one of the conducting state and the blocking state.

For example, referring to the example illustrated in FIG. 2, a source region 101 of the first conductivity type may be electrically connected with the first load terminal 11. The source region 101 may be n-doped, e.g., at a significantly greater dopant concentration as the drift region 100.

Further, a channel region 102 of the second conductivity type may separate the source region 101 and the drift region 100, e.g., the channel region 102 can isolate the source region 101 from the drift region 100, as it is known to skilled person acquainted with general principles of IGBT configurations. The channel region 102 may be p-doped, e.g. with an electrically activated dopant concentration within the range of 1e15 cm$^{-3}$ to 5e18 cm$^{-3}$. A transition between the channel region 102 and the drift region 100 may form a first pn-junction 1021.

For connecting the source regions 101 with the first load terminal 11, first contact plugs 113 can extend from the first load terminal 11 along the vertical direction Z so as to contact each of the source region 101 and the channel region 102.

The drift region 100 may extend along the vertical direction Z until it interfaces with a doped contact region 108 that is arranged in electrical contact with the second load terminal 12. The section of the drift region 100 arranged between region 105 (explained in more detail below) and the doped contact region 108 may form the major part of the drift region 100. In an embodiment, the dopant concentration of the drift region 100 increases in the lower section of the drift region 100 that forms the interface with the doped contact region 108, e.g., so as to form the field stop region of the first conductivity type, as it is known to the skilled person.

The doped contact region 108 may be formed in accordance with the configuration of the power semiconductor device 1; e.g., the doped contact region 108 can be an emitter region of the second conductivity type, e.g., a p-type emitter. For forming an RC-IGBT, the doped contact region 108 may be constituted by an emitter region of the second conductivity type that is interrupted by small sections of the first conductivity type that are also electrically connected to the second load terminal 12 and which are commonly referred to as "n-shorts".

For example, each IGBT cell 1-1 includes at least one control trench 14 having said control trench electrode 141 and at least one dummy trench 15 having a dummy trench electrode 151, wherein each of said trenches 14, 15 may extend into the semiconductor body 10 along the vertical direction Z and include an insulator 142, 152 that insulates the respective trench electrode 141, 151 from the semiconductor body 10.

The trench electrodes 141, 151 of the at least one control trench 14 and of the at least one dummy trench 15 may each be electrically coupled to a control terminal 13 of the power semiconductor device 1, in accordance with an embodiment.

Whereas FIG. 2 exemplarily illustrates that the dummy trench 15 is arranged adjacent to the control trench 14, it shall be understood that the IGBT cell 1-1 may comprise one or more further trenches of a type different from the control trench type and the dummy trench type, and that this at least one further trench may be arranged adjacent to the control trench 14. For example, said at least one further trench can be a source trench (reference numeral 16 in other drawings) whose trench electrode (reference 161 in other drawings) is electrically connected to the first load terminal 11. This will be explained in more detail below.

For example, the control terminal 13 is a gate terminal. Further, the control terminal 13 may be electrically connected to the control trench electrode 141 and electrically insulated from the first load terminal 11, the second load terminal 12 and the semiconductor body 10, e.g., by means of at least an insulation structure 132.

In an embodiment, the power semiconductor device 1 may be controlled by applying a voltage between the first load terminal 11 and the control terminal 13, e.g., so as to selectively set the power semiconductor device 1 into one of the conducting state and the blocking state.

For example, the power semiconductor device 1 is configured to be controlled based on a gate-emitter-voltage VGE, e.g., in a principle manner of controlling an IGBT known to the skilled person.

In an embodiment, the dummy trench electrode 151 may also be electrically connected to the control terminal 13 and thus receive the same control signal as the control trench electrode 141. In another embodiment, the dummy trench electrode 151 may be electrically coupled to the control terminal 13 by means of a resistor having a resistance within the range of 1e$^{-3}$ Ohm to 1 Ohm, within the range of 1 Ohm to 10 Ohm, or within the range of 10 Ohm to 100 Ohm. In another embodiment, the dummy trench electrode 151 is electrically connected to a second control terminal (not illustrated) and thus receives a control signal different from control trench electrode 141.

Further, each IGBT cell 1-1 of the power semiconductor device 1 may have at least one active mesa 18 electrically connected to the first load terminal 11, the active mesa 18 comprising the source region 101, the channel region 102 and a part of the drift region 100, wherein, in the active mesa 18, respective sections of these regions 101, 102, 100 can be arranged adjacent to a sidewall 144 of the control trench 14, as exemplarily illustrated in FIG. 2. For example, each of the source region 101 and the channel region 102 are electrically connected to the first load terminal 11, e.g., by means of the first contact plug 113.

In an embodiment of the power semiconductor device 1, the doped contact region 108 is a p-type emitter, and the active mesa 18 may entirely laterally overlap with the p-type emitter 108.

Further, the control trench electrode 141 (herein also referred to as control electrode 141) can be configured to receive a control signal from the control terminal 13 and to control the load current in the active mesa 18, e.g., by inducing an inversion channel in the channel region 102 so as to set the power semiconductor device 1 into the conducting state. Thus, a transition 181 between the first load terminal 11 and the active mesa 18 may provide for an interface for the load current to pass from the first load terminal 11 into the semiconductor body 10 and/or vice versa.

In an embodiment, the inversion channel in the active mesa 18 may be induced once an inversion channel threshold voltage, e.g., within the respective active mesa 18, is exceeded. For example, the inversion channel threshold voltage depends on at least one of the work function of the control electrode 141, the dopant concentration of the source region 101, the dopant concentration of the channel region 102, the relevant thickness of the trench insulator 142, the dielectric constant of the trench insulator 142.

In an embodiment, all active mesas 18 of the power semiconductor device 1 are configured with the same inversion channel threshold voltage.

For example, the control electrodes 141 of all IGBT cells 1-1 that are included in the active cell region 1-2 may be electrically connected to the control terminal 13.

In addition to the active mesa 18, each IGBT cell 1-1 of the power semiconductor device 1 can have at least one inactive mesa 19, e.g., arranged adjacent to the at least one dummy trench 15, wherein a transition 191 between the first load terminal 11 and the inactive mesa 19 provides an electrical insulation at least for charge carriers of the first conductivity type.

In an embodiment, the IGBT cell 1-1 may be configured to prevent the load current from crossing said transition 191 between the inactive mesa 19 and the first load terminal 11. For example, the inactive mesa 19 does not allow for inducing an inversion channel. In contrast to the active mesa 18, the inactive mesa 19 does not conduct the load current during the conducting state of the power semiconductor device 1, in accordance with an embodiment. For example, the inactive mesa 19 can be considered as a decommissioned mesa that is not used for the purpose of carrying the load current.

In a first embodiment of the inactive mesa 19, the inactive mesa 19 is not electrically connected to the first load terminal 11, but electrically insulated from, e.g., by means of an insulation layer 112. In this embodiment, the transition 191 between the first load terminal 11 and the inactive mesa 19 provides an electrical insulation not only for charge carriers of the first conductivity type, but also for charge carriers of the second conductivity type. To this end, in a variant the inactive mesa 19 comprises neither section of the source region 101 nor a section of the channel region 102 nor is the inactive mesa 19 contacted by means of a contact plug (cf. reference numeral 111), as illustrated in FIG. 2. In another variant, the inactive mesa 19 may be configured in a similar manner as the active mesa 18, e.g., by also comprising a section of the source region 101 and/or a section of the channel region 102, the difference to the active mesa 18 including that neither the section of the source region 101 (if present) nor the section of the channel region 102 of the inactive mesa 19 is electrically connected to the first load terminal 11. In accordance with the first embodiment of the inactive mesa 19, no current at all crosses said transition 191.

In a second embodiment of the inactive mesa 19, the inactive mesa 19 may be electrically connected to the first load terminal 11, wherein the transition 191 between the first load terminal 11 and the inactive mesa 19 provides an electrical insulation only for charge carriers of the first conductivity type, but not for charge carrier of the second conductivity type. In other words, in this second embodiment, the inactive mesa 19 may be configured at allow a current of charge carriers of the second conductivity type, e.g., a hole current, to pass said transition 191. For example, depending on the electrical potential of the dummy trench electrode 151, such hole current may only temporarily come into being, e.g., shortly before carrying out a turn-off operation, e.g., so as to reduce the total charge carrier concentration present in the semiconductor body 10. In an embodiment, this may also occur for such inactive mesas 19 with an electrical insulation only for charge carries of the first conductivity type in a reverse conducting IGBT configuration, where the load current would be temporarily carried through these inactive mesas 19 in diode mode operation, where the backside (cf. doped contact region 108) would be structured to comprise both emitters of the second conductivity type and emitters of the first conductivity type (previously referred to as "n-shorts"). As stated above, in this second embodiment, the inactive mesa 19 may be electrically connected to the first load terminal 11. For example, a doped contact region (not illustrated) of the second conductivity type (that is different from the electrically floating barrier region 105 mentioned below) of the inactive mesa 19 may be electrically connected to the first load terminal 11, e.g., by means of one of the first contact plugs 113, as schematically and exemplarily illustrated in FIG. 3B. The doped contact region (not illustrated) of the second conductivity type may isolate the section of the drift region 100 that is present within the inactive mesa 19 from the first load terminal 11. For example, in accordance with the second embodiment of the inactive mesa 19, within the inactive mesa 19, there is no region doped with dopants of the first conductivity type that is electrically connected to the first load terminal 11.

The above illustrated first embodiment and second embodiment of the inactive mesa 19 may allow for providing the configuration of the IGBT cell 1-1 to prevent the load current from crossing said transition 191 between the inactive mesa 19 and the first load terminal 11.

The inactive mesa 19 may be laterally confined by the control trench 14 and the dummy trench 15, or by the dummy trench 15 and another trench type, which will be elucidated further below. Further optional aspects of the inactive mesa 19 will be described below. For example, even though the dummy trench electrode 151 may be electrically connected to the control terminal 13, in an example, the dummy trench electrode 151 is not configured to control the load current in the inactive mesa 19, since the inactive mesa 19 does not allow for inducing an inversion channel within the inactive mesa 19, in accordance with an embodiment.

The power semiconductor device 1 may further comprise an electrically floating barrier region 105 of the second conductivity type (in the following also simply referred to as "barrier region"), as schematically exemplarily illustrated in FIG. 2. Exemplary features of this barrier region 105 will be explained in greater detail further below. Before the more detailed description of the barrier region 105, exemplary aspects regarding a Micro-Pattern-Trench-Structure (MPT) of the power semiconductor device 1 shall be explained.

Figure 3A:
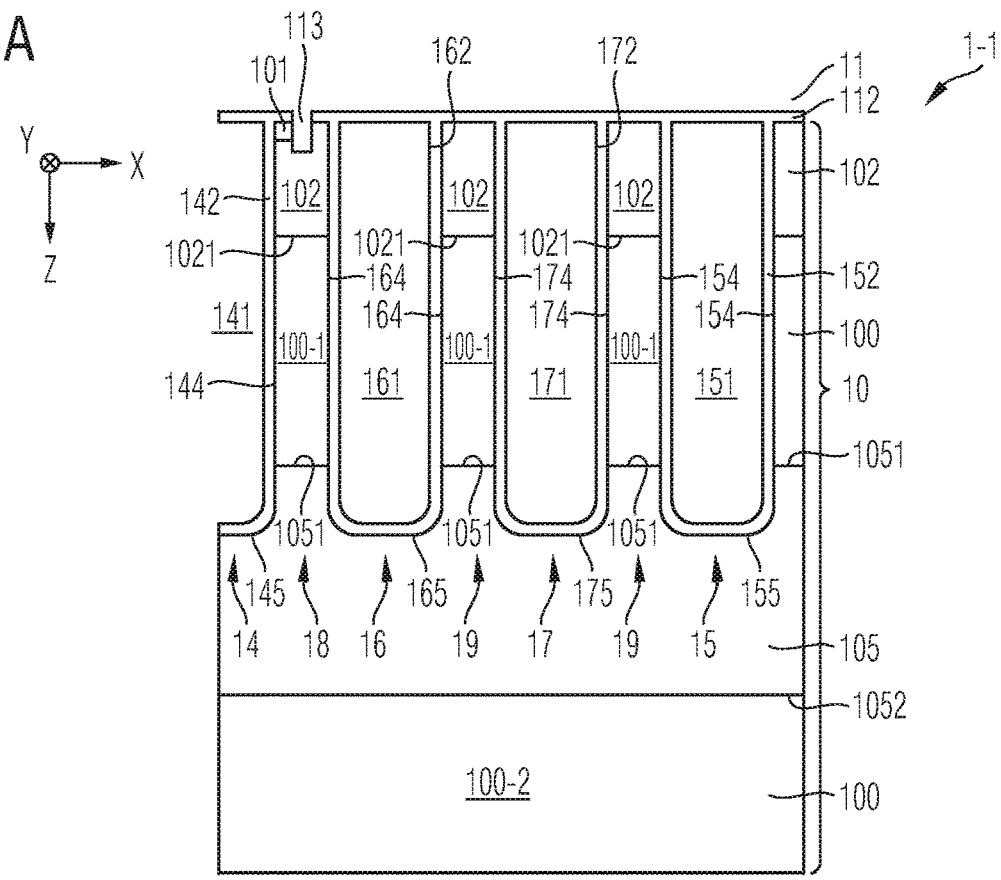
Figure 3B:
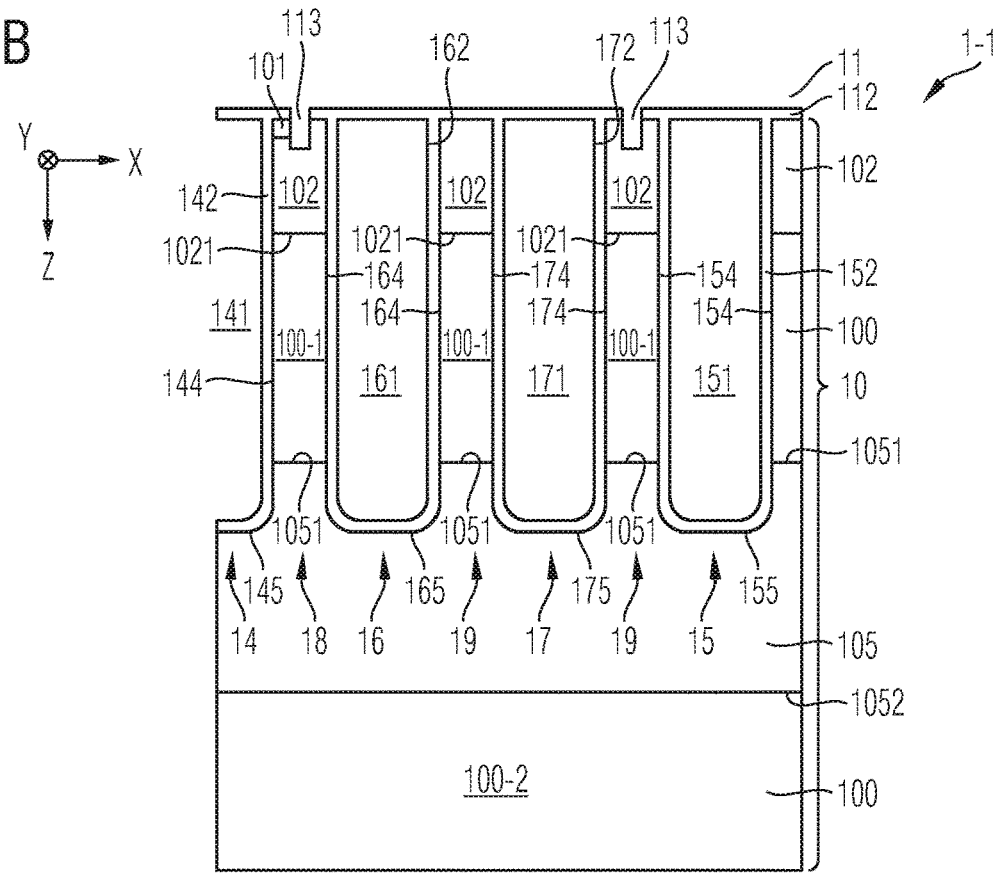

Referring to the embodiments schematically illustrated in FIGS. 3A-B, each IGBT cell 1-1 of the active cell region 1-2 may further comprise at least one source trench 16 that extends into the semiconductor body 10 along the vertical direction Z and includes an insulator 162 that insulates a source trench electrode 161 from the semiconductor body 10, the source trench electrode 161 being electrically connected to the first load terminal 11. For example, the at least one source trench 16 is arranged between the control trench 14 and the dummy trench 15, as illustrated in FIGS. 3A-B. In an embodiment, each IGBT cell 1-1 may comprise more than one source trench 16, e.g., two source trenches 16 (cf. FIG. 4A) or four source trenches 16 (cf. FIG. 6A), wherein each of the trench electrodes 161 of the source trenches may be electrically connected to the first load terminal 11. For example, the more than one source trenches 16 are arranged between the control trench 14 on the one side and the dummy trench 15 on the other side.

In an embodiment, the active mesa 18 may be laterally confined by the control trench 14 and the source trench 16. For example, the sidewall 144 of the control trench 14 and a sidewall 164 of the source trench 16 confine the active mesa 18 along the first lateral direction X. The active mesa 18 may be configured in a manner that has exemplarily described with respect to FIG. 2; e.g., the first contact plug 113 may electrically connect each of the section of the channel region 102 and the section of the source region 101 to the first load terminal 11.

Further, in accordance with the embodiment illustrated in FIGS. 3A-B and 4A-B, each IGBT cell 1-1 of the active cell region 1-2 may comprise more than one inactive mesas 19, wherein at least one of the inactive mesas 19 can be laterally confined by the source trench 16 and the dummy trench 15. Another inactive mesa 19 can be laterally confined by two source trenches 16. Another inactive mesa 19 can be laterally confined by two dummy trenches 15. Yet another inactive mesa 19 can be laterally confined by one of the dummy trenches 15 and the control trench 14. As illustrated, each of the inactive mesas 19 may comprise a respective section of the channel region 102, wherein, in an embodiment, these sections are not electrically connected to the first load terminal 11 but electrically insulated them from, e.g., by means of the insulation layer 112, as has been explained above.

Referring to the embodiment schematically illustrated in FIGS. 3A-B, each IGBT cell 1-1 of the active cell region may further comprise, in addition to or as an alternative to the at least one source trench 16, at least one floating trench 17 that extends into the semiconductor body 10 along the vertical direction Z and includes an insulator 172 that insulates a trench electrode 171 from the semiconductor body 10, the trench electrode 171 of the floating trench 17 being electrically floating. In an embodiment, the trench electrode 171 of the floating trench 17 is neither electrically connected to the first load terminal 11, nor electrically connected to the second load terminal 12, nor electrically connected to the control terminal 13, nor to a section of the semiconductor body 10.

In an embodiment, the electrically floating trench electrode 171 is connected, by means of a connection having a high ohmic resistance, to a defined electrical potential (e.g., to an electrical potential of a contact or to an electrical potential of another semiconductor region). For example, by means of said high ohmic connection, during a switching operation, the electrical potential of the electrically floating trench electrode 171 is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 1e2Ω, or to more than 1e6Ω. In an embodiment, an ohmic resistance, e.g. measured during a standstill situation, between the first load terminal 11 and the electrically floating trench electrode 171 amounts to more than 1e2Ω, or to more than 1e6Ω.

For example, if present, the at least one floating trench 17 can be arranged between the control trench 14 and the dummy trench 15. Further, as illustrated in FIGS. 3A-B, the IGBT cell 1-1 may additionally comprise said at least one source trench 16, wherein the source trench 16 and the floating trench 17 may be arranged between the control trench 14 on the one side and the dummy trench 15 on the other side. In an embodiment, the active mesa 18 is laterally confined by the sidewall 144 of the control trench 14 and the sidewall 164 of the source trench 16. The inactive mesa 19 may be laterally confined by at least two of the group of the sidewall 164 of the source trench 16, the sidewall 174 of the floating trench 17, and the sidewall 154 of dummy trench 15.

Thus, in accordance with an embodiment, each IGBT cell 1-1 of the active region comprises at least one control trench 14, at least one dummy trench 15, at least one source trench 16 and, optionally, at least one floating trench 17, wherein the at least one source trench 16 and (if present) the at least one floating trench 17 (if present) can be arranged between the control trench 14 and the dummy trench 15.

In an embodiment, the power semiconductor device 1 can be an IGBT and each of its IGBT cells 1-1 of its active region 1-2 may exhibit a micro pattern trench (MPT) structure.

For example, each or at least most of the trenches 14, 15, 16, 16, 17 that may be included in the IGBT cell 1-1 may exhibit equal spatial dimensions and may be arranged in accordance with a regular pattern. For example, each of the trenches 14, 15, 16, 16, 17 may exhibit a depth along the vertical direction Z within the range of 3 μm to 8 μm, and a width along the first lateral direction X within the range of 0.4 μm to 1.6 μm. The trenches 14, 15, 16, 17 can be formed according to a first layout having a first pitch, wherein the first layout may define each of the trench widths and the mesa widths.

Further, each or at least most of the trench electrodes 141, 151, 161, 171 of all trenches 14, 15, 16, 16, 17 that may be included in the IGBT cell 1-1 may exhibit equal spatial dimensions, e.g., regarding the total extension along the vertical direction (which is terminated by means of the respective trench bottoms 145, 155, 165, 175) and the total extension in the first lateral direction (i.e., the trench width, which is terminated by means of the respective sidewalls 144, 154, 164, 174), and/or regarding the dimensions of the insulators 142, 152, 162, 172. In addition, each of the trenches 14, 15, 16, 16, 17 that may be included in the IGBT cell 1-1 can be arranged equidistantly along the first lateral direction X. For example, each of the mesas 18 and 19 of the IGBT cell 1-1 may exhibit the same width, which may be within the range of 0.1 μm to 0.3 μm, within the range of 0.3 μm to 0.8 μm, or within the range of 0.8 μm to 1.4 μm.

Further, some of the trenches 14, 15, 16, 16, 17 that may be included in the IGBT cell 1-1 may extend into the barrier region 105, e.g., by at least 100 nm, by at least 500 nm or by at least 1000 nm. This aspect will also be explained in greater detail below.

For the following explanations, these abbreviations may apply:
G=control trench 14
D=dummy trench 15
S=source trench 16
F=floating trench 17
k=active mesa 18
o=inactive mesa 19

As has been stated above, the power semiconductor device 1 may comprise a plurality of equally configured IGBT cells 1-1 within the active cell region 1-2. In an embodiment, using the abbreviations introduced above, an exemplary neighborhood relationship within in each IGBT cell 1-1 of the active cell field 1-2 may be expressed as follows:
oDoSoSkGkSoSoD Without being limited to this exemplary neighborhood relationship (which is also being referred to as contacting scheme herein), the embodiments according to most of the remaining drawings are based on the above identified exemplary neighborhood relationship. Thus, it shall be understood that the IGBT cells 1-1 must not necessarily comprise a floating trench 17, in accordance with an embodiment.

For example, in another embodiment, each of the IGBT cells 1-1 only comprise one or more control trenches 14 and one or more source trenches 16. Further, in such embodiment, each of the IGBT cells 1-1 only comprises one or more active mesas 18, but no inactive mesas 19. E.g., the contacting scheme may then be "kGkS" or the like. Then, every trench electrode connected to the control terminal 13 would indeed control an active mesa, e.g., by controlling a respective inversion channel and there would hence no dummy trenches. In yet another embodiment, the IGBT cells 1-1 only comprise one or more control trenches 14 and one or more active mesas, but neither inactive mesas nor a dummy trench, nor a source trench, nor a floating trench.

As indicated above, irrespective of the contacting scheme, the power semiconductor device 1 may further comprise an electrically floating barrier region 105 of the second conductivity type (in the following also simply referred to as "barrier region").

In an embodiment, the barrier region 105 is configured to provide for an electrically conductive path between a section of the active mesa 18 and the bottom 155 of the dummy trench 15. Thus, the barrier region 105 may be configured to guide the electrical potential of the section of the active mesa 18 to the bottom 155 of the dummy trench 15. For example, the barrier region 105 may extend into the active mesa 18 and from there below the bottom 165 of the source trench 16 and across the inactive mesa 19 so as to interface with the bottom 155 of the dummy trench 15.

As has been stated above, the power semiconductor device 1 may comprise a plurality of IGBT cells 1-1, e.g., most of them included in the active cell region 1-2. For example, the barrier region 105 connects the inactive mesas 19 included in the plurality of IGBT cells 1-1 within the active region 1-2 with each other. For example, to this end, the barrier region 105 may extend partially into each of the inactive mesas 19. The barrier region 105 may further extend, at least partially, into some of the active mesas 18. Each of the dummy trench bottoms 155 may extend into the barrier region 105. Thereby, the barrier region 105 can guide the electrical potential present within the active mesas towards the dummy trench electrodes 151.

As will be explained in more detail below, the barrier region 105 may laterally overlap with some (parts) of the active mesas 18 and may not laterally overlap with other (parts) of the active mesas 18. For example, to this end, the barrier region 105 may exhibit a lateral structure formed by one or more passages 1053, as will be explained in more detail below, and/or the barrier region 105 may be laterally displaced from the edge termination region 1-3 by means of the transition region 1-5 that may (as explained above) be equipped with one or more active mesas 18.

Hence, in more general terms, in accordance with an embodiment, a power semiconductor device 1 is presented that comprises the first load terminal 11 and the second load terminal 12. The power semiconductor device 1 is configured to conduct the load current along the vertical direction Z between said terminals 11,12 and comprises: the drift region 100 of the first conductivity type; the plurality of IGBT cells 1-1, wherein each of the IGBT cells 1-1 comprises a plurality of trenches (e.g., 14, 15, 16) that extend into the drift region 100 along the vertical direction Z and that laterally confine the at least one active mesa 18, the at least one active mesa 18 comprising an upper section 100-1 of the drift region 100. The electrically floating barrier region 105 of the second conductivity type that is spatially confined, in and against the vertical direction Z, by the drift region 100.

The total volume of all active mesas 18 can be divided into a first share and into a second share, the first share not laterally overlapping with the barrier region 105 and the second share laterally overlapping with the barrier region 105. For example, the first share of the active mesas 18 laterally overlaps with the at least one passage 1053 (cf. explanations further below) of the barrier region 105 or with another section of the drift region 100 where the barrier region 105 is not present (e.g., within the transition region 1-5). In contrast, the second share of the active mesas 18 laterally overlaps with the barrier region 105. For example, the load current conducted by the second share traverses the barrier region 105.

In an embodiment, the first share is configured to carry the load current at least within the range of 0% to 100% of the nominal load current for which the power semiconductor device is designed. The second share may be configured to carry the load current if it exceeds at least 0.5% of the nominal load current.

Hence, the first share of active mesas 18 can be considered as an "ignition volume" which, e.g., during turn-on of the power semiconductor device 1 starts to conduct the load current whereas the second share initially remains inactive. Then, if, e.g., only if the load current exceeds a threshold of, e.g., at least 0.5% of the nominal load current (wherein this threshold can be higher than 0.5%, e.g., higher than 1%, e.g., at least 5% or at least 10%), the barrier region 105 may become more conductive such that the second share may also carry the load current.

For example, for small load currents below 10%, or below 1%, or below 0.5% of the nominal load current of the power semiconductor device 1, the active mesas 18 without lateral overlap with barrier region 105 (i.e., said first share of the total volume) may act as emitters of charge carriers of the first conductivity type, and, e.g., by this avoid a snapback in the transfer or output characteristics of the power semiconductor device 1. For larger load currents (greater than 0.5%, than 1%, than 5% or than 10% of the nominal load current) the upper pn-junction 1051 is in a forward bias mode with respect to the charge carriers of the first conductivity type. This may then allow also for charge carriers of the first conductivity type to be emitted by the active mesas 18 laterally overlapping with the barrier region 105 (i.e., said second share of the total volume).

As already explained above, each active mesa 18 can be configured to induce an inversion channel within the respective active mesa 18. For example, all active mesas 18 are configured with the same inversion channel threshold voltage. Thus, the delay between the begin of the load current conduction within the second volume share and the begin of the load current conduction within the first volume share (according to which, e.g., during turn-on, the second volume share of the active mesas 18 that laterally overlaps with the barrier region 105 only carries the load current once the load current exceeds said threshold value of, e.g., at least 0.5%) exemplarily described above is, e.g., neither caused by means of providing a control signal to the control electrodes controlling the first volume share different from a control signal provided to the control electrodes controlling the second volume share, nor by a difference between inversion channel threshold voltages. Rather, the first volume share and the second volume share are provided with the same control signal and are configured with the same inversion channel threshold voltage and said delay is achieved only by accordingly positioning and/laterally structuring the barrier region 105, in accordance with an embodiment.

Hence, in an embodiment, the only differentiating feature between the first volume share of the active mesas 18 and the second volume share of the active mesas 18 is that the first volume share does not laterally overlap with the barrier region 105 and that the second volume share does laterally overlap with the barrier region 105. For example, thereby, the said exemplarily described delay between the load current conduction begins (starting times) is achieved.

For example, once the load current is conducted by both volume shares, it may be distributed among the volume shares in accordance with the ratio between the volume shares. In an embodiment, if the load current exceeds 50% of the nominal load current, the ratio between a first load current share conducted by the first volume share of the active mesas 18 and a second load current share conducted by the second volume share of the active mesas 18 can be at least within 10% of the ratio between the first volume share and the second volume share or, respectively, the ratio between the first load current share conducted by the first volume share of the active mesas 18 and the second load current share conducted by the second volume share of the active mesas 18 can be (at least substantially) identical to the ratio between the first volume share and the second volume share.

The electrically floating barrier region 105 can be spatially confined, in and against the vertical direction Z, by the drift region 100. Hence, the barrier region 105 may form each of an upper pn-junction 1051 and a lower pn-junction 1052 with the drift region 100, wherein the lower pn-junction 1052 can be arranged lower than each of the bottom 155 of the dummy trench 15. For example, the upper pn-junction 1051 is arranged within the inactive mesa(s) 19 and, hence, above the bottom 155 of the dummy trench 15. The distance between the first pn-junction 1021 and the upper pn-injunction 1051 along the vertical direction Z may amount to at least 0.5 µm. Thus, the two pn-junctions 1021 and 1051 are not identical to each other, but separated from each other by means of the drift region 100, in accordance with an embodiment.

In other words, the barrier region 105 may be separated from the channel region 102 by means of at least a part of the drift region 100. For example, the barrier region 105 is confined, along the vertical direction Z, by an upper section 100-1 of the drift region 100 on the one side and by a lower section 100-2 of the drift region 100 on the other side, wherein said upper section 100-1 forms a transition to the channel regions 102 of the IGBT cells 1-1. The lower section 100-2 may extend along the vertical direction Z until it interfaces with the doped contact region 108, which may be, as illustrated above, a p-type emitter.

In an embodiment, the barrier region 105 is not in contact with any other semiconductor region of the second conductivity type, but separated therefrom, e.g., by means of section(s) of the drift region 100. For example, the distance between the barrier region 105 to the closest other semiconductor region of the second conductivity type amounts to at least 1 µm or to at least 2 µm. Thus, for example, there is no p-type connection between the channel regions 102 and the barrier region 105, nor is there a p-type connection between the barrier region 105 and a well region 109 of the edge termination region 109 (mentioned further below). Along said distance, a portion of the drift region 100 may be present.

With respect to all embodiments discussed above, it shall be understood that, in accordance with a variant, the sections of the drift region 100 that are included in the mesas 18 and 19, e.g., the upper sections 100-1 forming the first pn-junction 1021 with the channel region 102 and the upper pn-junction 1051 with the barrier region 105 (cf. explanations below), may exhibit a dopant concentration at least twice as great as compared to the dopant concentration of the section of the drift region 100 arranged below the barrier region 105, e.g., said lower section 100-2 of the drift region 100 that forms the lower pn-junction 1052 with the barrier region 105.

Said sections (upper sections 100-1) of the drift region 100 that are included in the mesas 18 and 19 may each exhibit a maximum dopant concentration within the range of 1e14 cm$^{-3}$ to 4e17 cm$^{-3}$, e.g., a maximum dopant concentration of at least 1e16 cm$^{-3}$. For example, said sections of the drift region 100 that are included in the mesas 18 and 19 and that may exhibit said increased dopant concentrations can be referred to as "n-barrier regions". For example, the dopant concentration of the sections of the drift region 100 that are included in the mesas 18 and 19 is chosen such that the upper pn-junction 1051 remains at a level slightly above the trench bottoms 145 and 155.

Figure 4B:
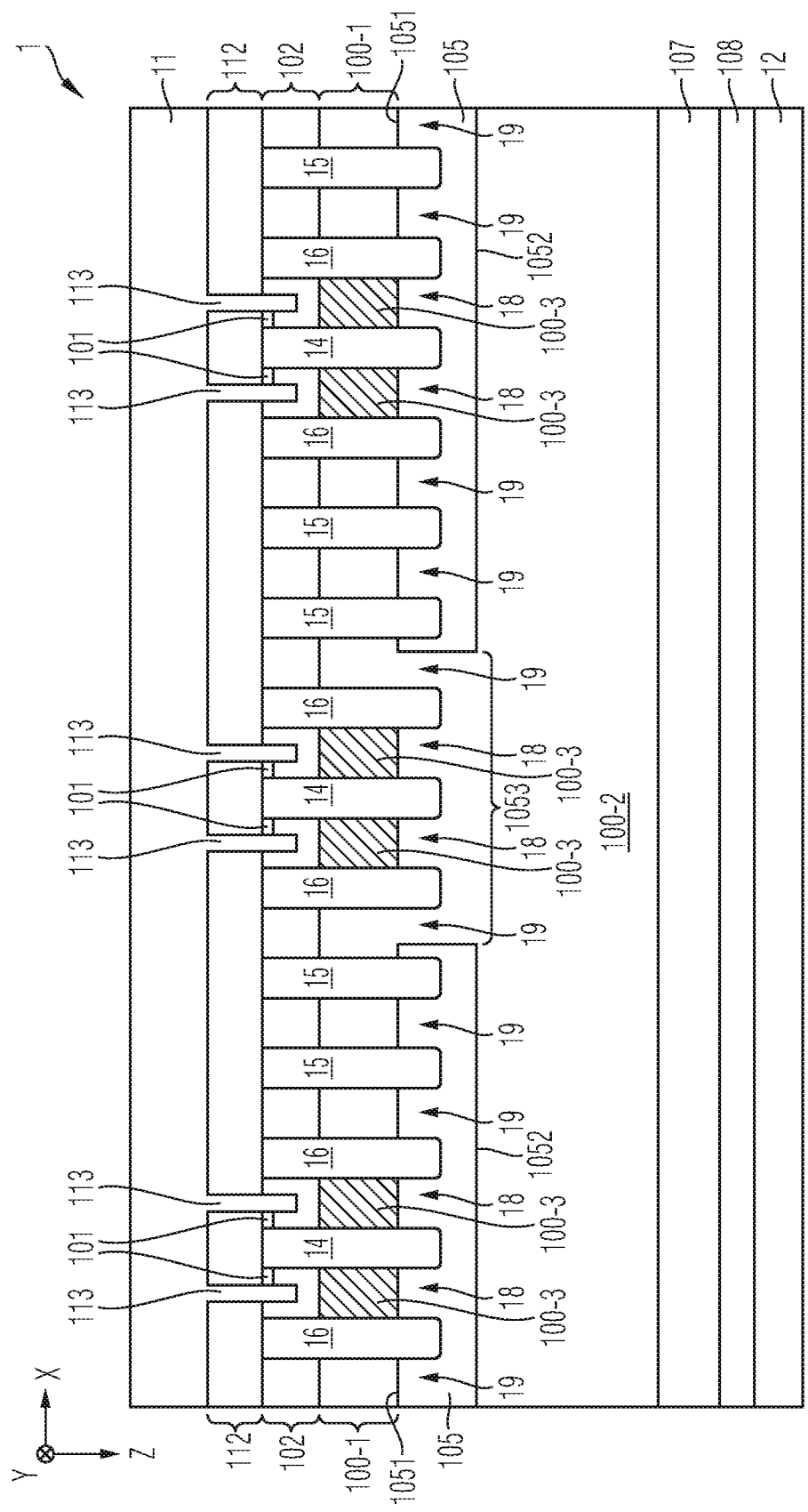

Now referring to FIG. 4B, in accordance with a variant, the increased dopant concentration in the upper section (section 100-1) of the drift region 100 is only locally provided. For example, only one of the active mesas 18, or only several of the active mesas 18, or only all of the active mesas 18 comprise a local n-barrier region 100-3. For example, each of the local n-barrier regions 100-3 is arranged above the barrier region 105 or, respectively, the barrier region passage 1053, and below the respective channel region 102. For example, each n-barrier region 100-3 is arranged in contact with the respective channel region 102 and extends from there down along the vertical direction Z until it interfaces with the (p-) barrier region 105 or, respectively, terminates at a corresponding Z-level if (p-) barrier 105 is absent/exhibits a passage 1053 at the respective location. Along the first lateral direction X, each n-barrier region 100-3 may fill the respective active mesa 18. Each n-barrier region 100-3 may exhibit a maximum dopant concentration at least twice as great as the dopant concentration of the lower section 100-2 of the drift region 100. For example, each n-barrier region 100-3 exhibits a maximum dopant concentration within the range of 1e14 cm$^{-3}$ to 4e17 cm$^{-3}$, e.g., a maximum dopant concentration of at least 1e16 cm$^{-3}$. In contrast, in accordance with this variant, the upper section 100-1 of the drift region included in the inactive mesas 19 may exhibit a maximum dopant concentration substantially equal to the maximum dopant concentration of the lower section 100-2 of the drift region 100; e.g., there are no n-barrier regions 100-3 provided within the inactive mesas 19.

In a variant (not illustrated), the upper pn-junction 1051 may even be arranged lower than each of the bottom 155 of the dummy trench 15 and said bottom 145 of the control trench 14 (wherein this example is not illustrated). In that case, a distance along the vertical direction Z between the bottom 155 of the dummy trench 15 and the upper pn-junction 1051 can be smaller than 3 µm, smaller than 2 µm, or even smaller than 1 µm.

For example, the barrier region 105 exhibits a thickness along the vertical direction Z within the range of 0.1 µm to 0.5 µm, within the range of 0.5 µm to 1 µm, or within the range of 1 µm to 5 µm.

The common vertical extension range along the vertical direction Z between the barrier region 105 the trenches that extend into the barrier region 105 maybe within the range of 50 nm to 3000 nm, for example. In an embodiment, the barrier region 105 extends further along the vertical direction Z (i.e., down to a deeper level within the semiconductor body 10) as compared to all or, respectively, at least most of the trenches.

The barrier region 105 may exhibit a resistivity of more than 10 Ωcm and of less than 1000 Ωcm, e.g., of more than 100 Ωcm and of less than 500 Ωcm, in accordance with an embodiment.

The barrier region 105 may include at least one of boron (B), aluminum (Al), difluoroboryl (BF$_2$), boron trifluoride (BF$_3$), or a combination thereof. A respective one of these exemplary materials may serve as the dopant material, in accordance with an embodiment. Further, a respective one of these exemplary materials can be implanted into the semiconductor body 10 so as to form the barrier region 105.

For example, the barrier region 105 exhibits an electrically activated dopant concentration greater than 1e14 cm$^{-3}$ and smaller than 4e17 cm$^{-3}$. Said dopant concentration, e.g., amounting to approximately 1e16 cm$^{-3}$, may be present with an extension along the vertical direction Z of at least 0.5 µm, or of at least 1 µm. Further, the barrier region 105 may exhibit a maximum dopant concentration in a region where the bottom 155 of the dummy trench 15 extends into the barrier region 105.

In an embodiment, the dopant concentration of the barrier region 105 is smaller than the dopant concentration present in the channel regions 102. For example, the maximal dopant concentration of the barrier region 105 is within the range of 1% to 80% of the dopant concentration present in the channel region 102.

Figure 5:
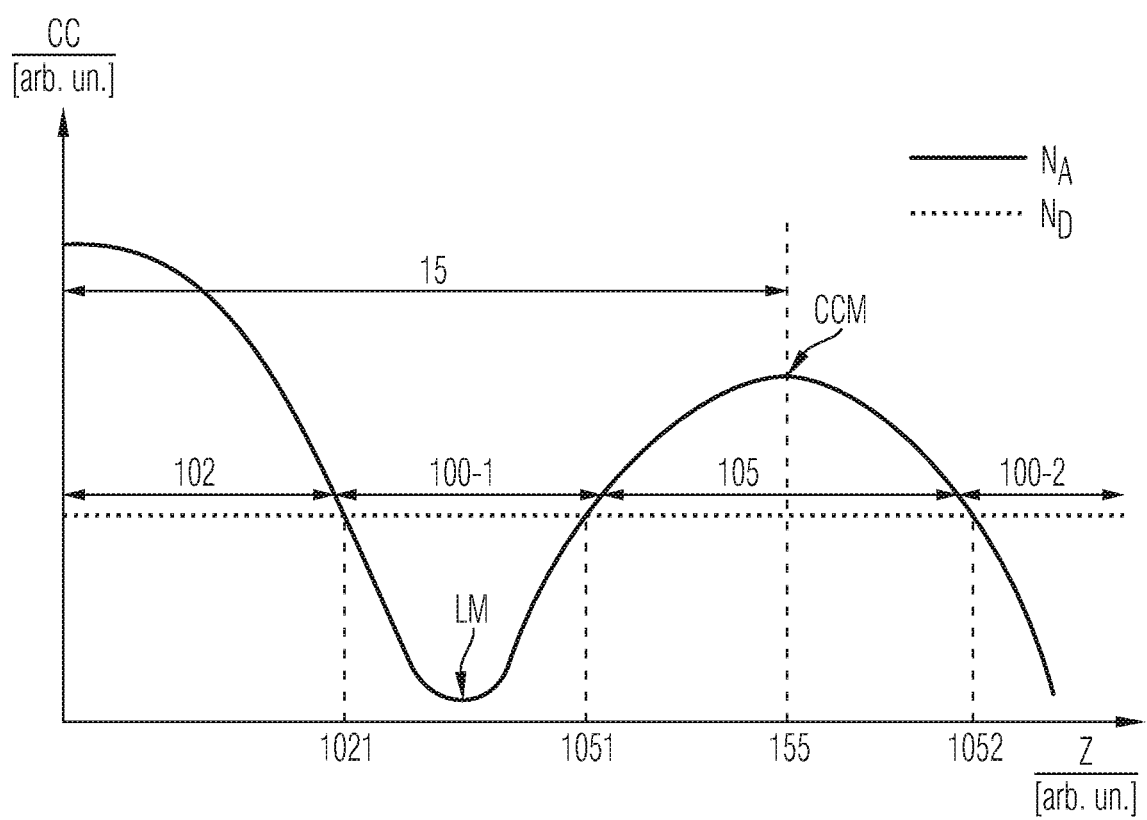
FIG. 5 schematically and exemplarily illustrates a course of a dopant concentration in a power semiconductor device in accordance with one or more embodiments.

An exemplary course of the dopant concentration (CC) of dopants of the second conductivity type along the vertical direction Z is illustrated in FIG. 5, wherein the solid line indicates of dopant concentration the second conductivity type ($N_A$) and the dotted line the indicates of dopant concentration the first conductivity type ($N_D$). Accordingly, in an upper section, e.g., in proximity to the first load terminal 11, the dopant concentration $N_A$ may be comparatively high so as to provide for the channel region 102 (that is not or is not electrically connected to the first load terminal in case of the inactive mesa 19, depending on the configuration of the inactive mesa 19, as explained above). The dopant concentration $N_A$ then decreases rapidly in a section of the mesa where the drift region 100 (said upper section 100-1) is present. The transition between the channel region 102 and the upper section 100-1 of the drift region 100 may form said first pn-junction 1021 within the respective mesa. In case the inactive mesa 19 does not comprise a section of the channel region 102, the value of the dopant concentration CC between the beginning at the first load terminal 11 and the beginning of the barrier region 105 would accordingly be at the value corresponding to the local minimum LM illustrated in FIG. 5, or lower. Then, e.g., before the respective trench bottom 155, the dopant concentration $N_A$ increases (again) so as to form the barrier region 105. The transition with between the upper section 100-1 of the drift region 100 and the barrier region 105 forms the upper pn-junction 1051. As illustrated, the barrier region 105 may exhibit its dopant concentration maximum CCM at the depth level being substantially identical to the level where the respective trench terminates, e.g., at the level of the bottom 155 of the dummy trench 15. The dopant concentration $N_A$ then decreases again so to form the lower pn-junction 1052 with the lower section 100-2 of the drift region 100.

For example, the electrically floating barrier region 105 is not electrically connected with a defined electrical potential, e.g., neither to the first load terminal 11, nor to the second load terminal 12, nor to the control terminal 13. In an embodiment, the electrically floating barrier region 105 is connected, by means of a connection having a high ohmic resistance, to a defined electrical potential (e.g., to an electrical potential of a contact or to an electrical potential of another semiconductor region). For example, by means of said high ohmic connection, during a switching operation, the electrical potential of the barrier region 105 is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 1e2Ω, or to more than 1e6Ω.

In an embodiment, an ohmic resistance, e.g. measured during a standstill situation, between the first load terminal 11 and the barrier region 105 amounts to more than 1e2Ω, or to more than 1e6Ω.

For example, for ensuring that the barrier region 105 is electrically floating, the barrier region 105 does not extend into the transition region 1-5; e.g., the barrier region 105 can exclusively be arranged within the active cell region 1-2, as illustrated in FIG. 1.

For example, the barrier region 105 does not extend into the transition region 1-5. As has been explained above, the transition region 1-5 may be equipped with some of the IGBT cells 1-1 and hence be considered as an active region of the power semiconductor device 1, i.e. a part of the power semiconductor device 1 that also conducts a part of the load current.

In an embodiment, the transition region 1-5 does neither include a section of the electrically floating barrier region 105 nor any further electrically floating semiconductor region of the second conductivity type. For example, there is no floating p-doped semiconductor region included in the transition region 1-5.

The barrier region 105 is electrically floating, and, at the same time, the barrier region 105 can be arranged in contact with at least some of the trenches of the IGBT cells 1-1, as has been explained above. Thus, the barrier region 105 may interface with the trench insulators 142, 152 and 162. For example, at least the source trench bottom 165 and/or at least the dummy trench bottom 155 extend into the barrier region 105, e.g., such that the source trench electrode 161, the dummy trench electrode 151 and the barrier region 105 have a common vertical extension range along the vertical direction Z of at least 100 nm, of at least 50 nm or of at least 1000 nm (wherein the barrier region 105 may extend further along the vertical direction Z as compared to the trench bottoms).

Figure 6A:
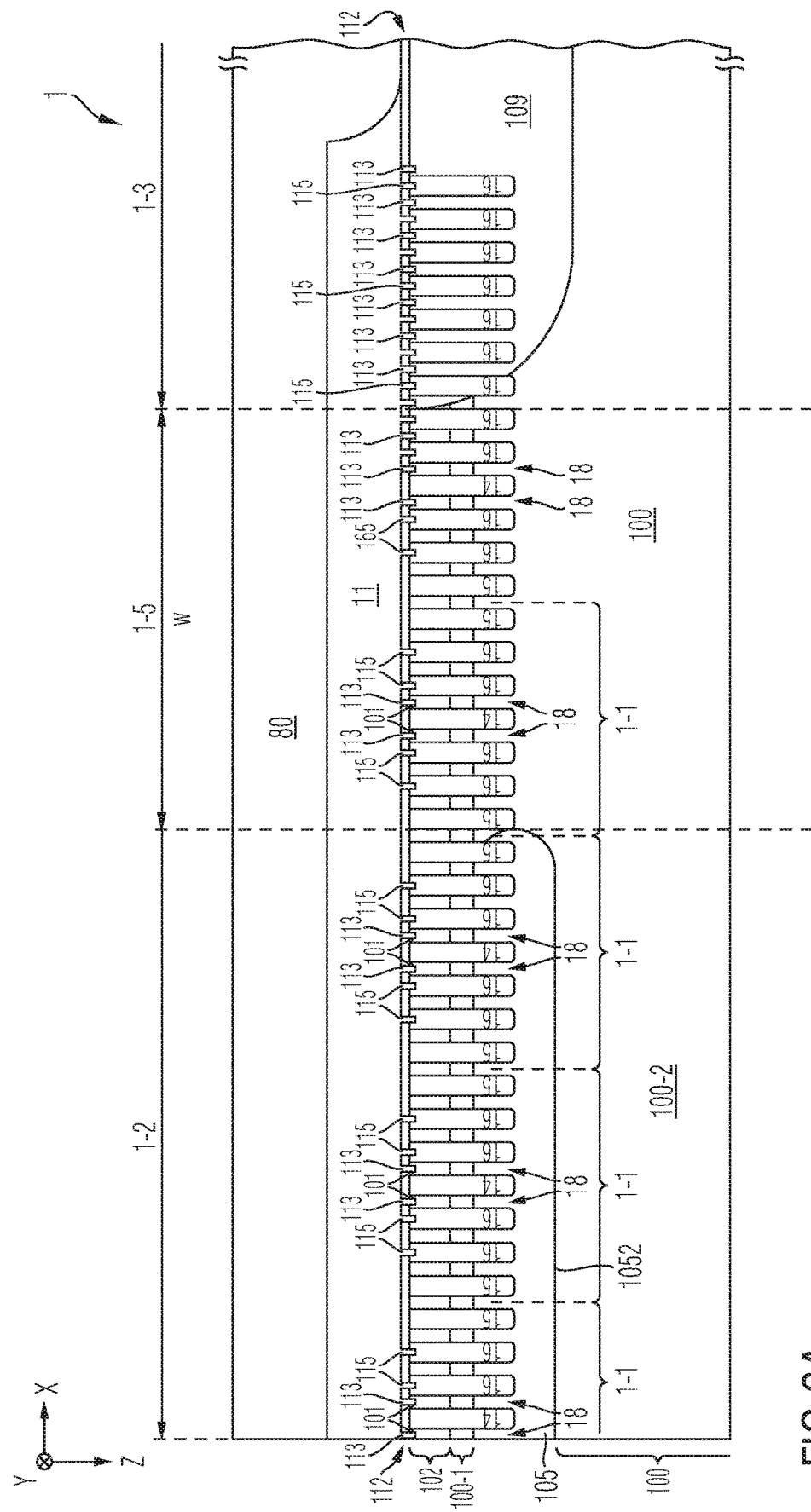
FIGS. 6A-6C schematically and exemplarily illustrate a section of a vertical cross-section of a power semiconductor device in accordance with one or more embodiments.
Figure 6B:
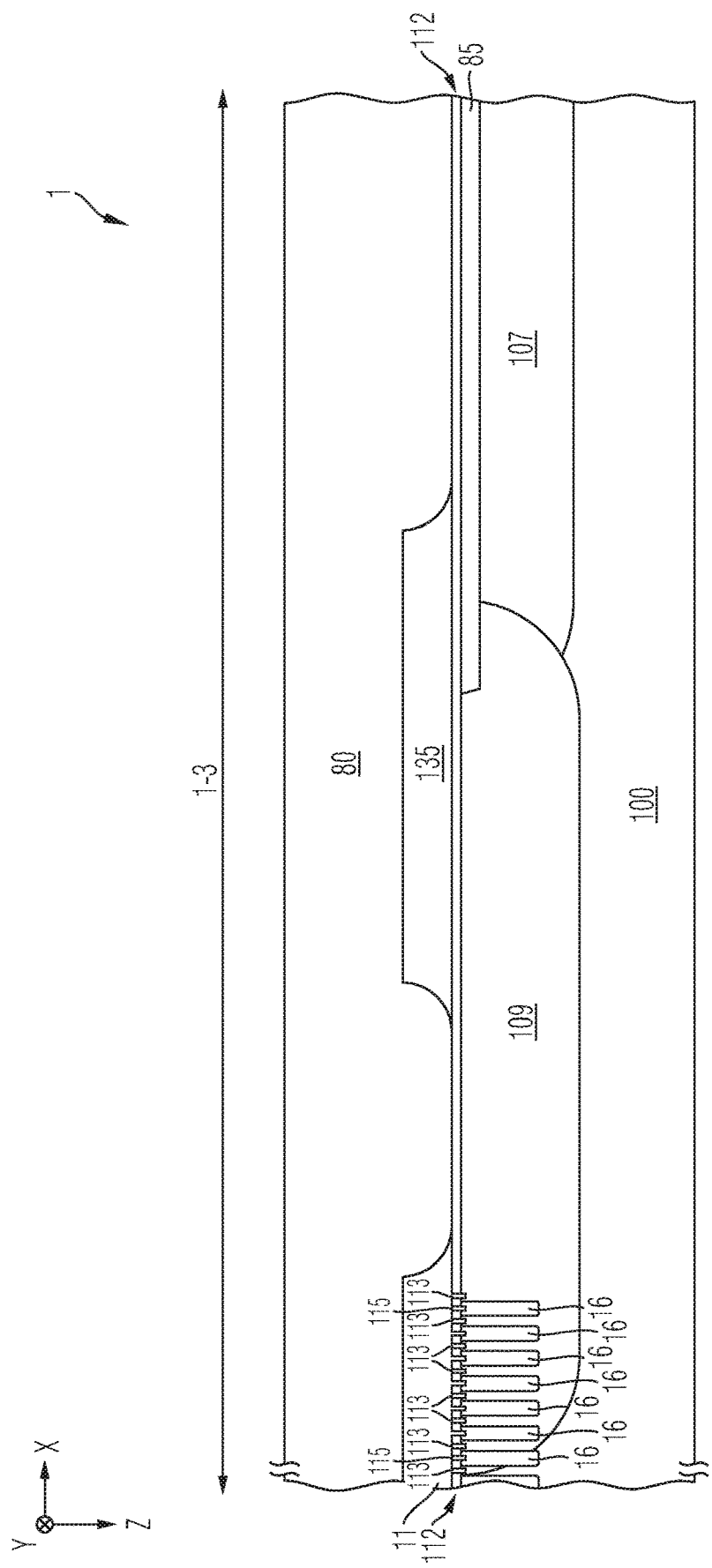
Figure 6C:
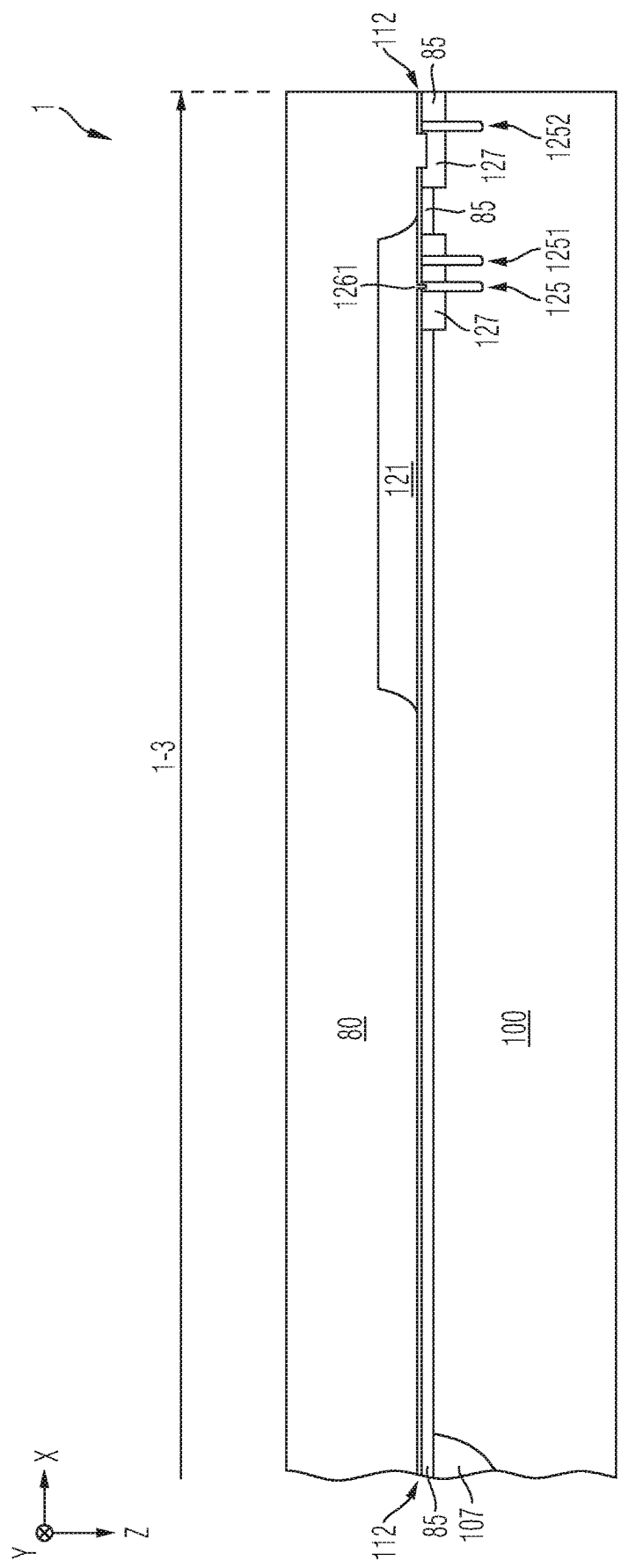

This aspect shall be elucidated in more detail with respect to FIGS. 6A-C, which exemplarily and schematically illustrated a section of a vertical cross-section of the power to semiconductor device 1 in accordance with one or more embodiments, wherein FIG. 6B shows a continuation from the section of FIG. 6A along the first lateral direction X, and wherein FIG. 6C shows a continuation from the section of FIG. 6B along the first lateral direction X.

Starting at FIG. 6A, the first load terminal 11 may be partially covered by an insulation structure 80, e.g., an encapsulation. Within the active cell region 1-2, there is arranged a plurality of said IGBT cells 1-1, each of which exhibits said exemplary contacting scheme/neighborhood relationship, namely: "oDoSoSkGkSoSoD". In another embodiment, a different contacting scheme is employed.

The active mesas 18 are electrically connected to the first load terminal 11 by means of said first contact plugs 113, and the source electrodes 161 of the source trenches 16 are electrically connected to the first load terminal 11 by means of second contact plugs 115. The control electrodes 141 of the control trenches 14 and the dummy electrodes 151 of the dummy trenches 15 are electrically connected to the control terminal 13, e.g., by means of a gate runner 135 (cf. FIG. 6B).

Within the transition region 1-5, there is arranged one further IGBT cell 1-1 that may also exhibit the contacting scheme "oDoSoSkGkSoSoD" or a contacting scheme different therefrom. Further along the first lateral direction X, there is arranged one further dummy trench 15, further source trenches 16 and one control trench 14, adjacent to which there are arranged two active mesas 18. Hence, within the transition region 1-5, a part of the load current can be conducted.

The trench pattern may continue along the first lateral direction X also within the edge termination region 1-3, wherein such trenches within the edge termination region 1-3 may be source trenches 16. The mesas between said source trenches 16 may be electrically connected to the first load terminal 11 by means of the first contact plugs 113. Hence, the arrangement of the source trenches 16 and the mesas in between these trenches that are electrically connected to the first load terminal 11 may form charge carrier drainage cells.

Within the edge termination region 1-3, there can further be arranged a semiconductor well region 109 of the second conductivity type. For example, the well region 109 is p-doped and extends from the insulation layer 112 along the vertical direction Z, e.g., further as compared to the total extension of the trenches 14, 15, 16, and 16. For example, the well region 109 extends about as deep into the semiconductor body as the barrier region 105.

Still referring to FIG. 6A, the barrier region 105 may terminate at the transition between the active cell region 1-2 and the transition region 1-5. For example, the barrier region 105 is exclusively arranged within the active cell region 1-2 and does neither extend into the transition region 1-5 nor into the edge termination region 1-3.

On the other side, the well region 109 is exclusively arranged within the edge termination region 1-3 and does neither extend into the transition region 1-5 nor into the active cell region 1-2. As has been elucidated above, the transition region 1-5 may entirely surround the active cell region 1-2 and may in turn be entirely surrounded by the edge termination region 1-3. The minimum width W of the transition region 1-5, i.e., the minimum distance between the barrier region 105 and the well region 109 amounts to 1 μm, wherein said minim width may be greater than 1 μm, e.g. greater than 3 μm, greater than 5 μm or even greater than 10 μm or than 20 μm. Along said width W, a portion of the drift region 100 may be present.

As the well region 109 is electrically connected to the first load terminal 11, e.g., by means of said first contact plugs 113, as exemplarily illustrated, the electrical potential within the well region 109 can be substantially identical to the electrical potential of the first load terminal 11. Hence, by means of the transition region 1-5 and its minimum width W, it can be more reliably ensured that the barrier region 105 is indeed electrically floating.

In an embodiment, the well region 109 has an electrically activated maximal dopant concentration within the range of 1e15 to 5e18 cm$^{-3}$. It may extend along the vertical direction Z, e.g., further as the trenches 14, 15, 16, e.g. down to a level substantially corresponding to the lower pn-junction 1052 formed between the barrier region 105 and the drift region 100.

Now referring to FIG. 6B, the well region 109 may extend along the first lateral direction X until it interfaces with a semiconductor VLD (variation of the lateral doping) or JTE (junction termination extension) region 107. Also the VLD/JTE region 107 may be of the second conductivity type and may have a lower dopant concentration than the well region 109. In general, the concept of such VLD or JTE region within a termination structure of a power semiconductor device is known to the skilled person and, therefore, it is refrained from explaining the function of the VLD or JTE region 107 in greater detail herein. For safety reasons, the VLD/JTE region 107 may be isolated from the electrical potential of the gate runner 135 by means of a thicker oxide layer 85, which may be LOCOS layer or a recessed field oxide. Alternatively, other termination concepts known to the skilled person may be used.

For example, the gate runner 135 laterally overlaps with each of the well region 109 and the VLD region 107.

Now referring to FIG. 6C, the VLD region 107 may terminate at the position within the edge termination region 1-3 well before the chip edge 1-4. The region between the chip edge 1-4 and the termination of the VLD region 107 may essentially be constituted by an unstructured section of the drift region 100, wherein, in proximity to the chip edge 1-4, a channel stopper arrangement can be provided. In general, the concept of a channel stopper arrangement in proximity to the chip edge of the power semiconductor device is also known to the skilled person. For example, in accordance with the embodiment exemplarily illustrated in FIGS. 6A-C, for forming the channel stopper arrangement, there is provided a collector contact 121 that exhibits the electrical potential of the second load terminal 12. Connected thereto is an electrode of a trench 125. For example, trench 125 follows the course of the termination region 1-3 in that it also entirely surrounds the transition region 1-5. Further trenches 1251 and 1252 may be provided for forming the channel stopper arrangement. The trenches 125, 1251 and 1252 may be flanked by a semiconductor region 127 of the second conductivity type.

In an embodiment, the barrier region 105 has a lateral structure. For example, the barrier region 105 is formed as a laterally structured layer that extends throughout the entire active cell region 1-2, e.g., until it interfaces with the transition region 1-5. Hence, the barrier region 105 may be exclusively arranged within the active cell region 1-2 and does not extend into the transition region 1-5. Within the active cell region 1-2, the barrier region 105 can be laterally structured.

For example, the IGBT cells 1-1 are configured with a lateral structure according to a first layout having a first pitch, and wherein the lateral structure of the barrier region 105 is configured according to a second layout, the second layout having a second pitch at least twice as large as the first pitch. Hence, the lateral structure of the barrier region 105 can be coarser as compared to the trench pattern.

The lateral structure of the barrier region 105 can be formed by a plurality of pass-through passages 1053 (in the following also simply referred to as "passages"). Such concept is exemplarily illustrated in the general manner in FIG. 7. For example, according the second layout, each of the pass-through passages 1053 may exhibit a maximum lateral extension at least twice as large as a minimum trench width and/or a minimum mesa width formed in accordance with the first layout.

In an embodiment, the one or more passages 1053 provide for a load current passage for currents below 10% or even below 1% of the nominal load current of the power semiconductor device 1. For larger load currents, the whole active cell region 1-2, irrespective of whether parts bilaterally overlap with the barrier region 105 or not, carry the load current. Thus, in accordance with an embodiment, for load currents below 10% or even below 1% of the nominal load current does not have to traverse the barrier region 105, but may path through the one or more passages 1053. For example, the barrier region 105 is absent, i.e., exhibits said passages 1053, in a vertical projection (along the vertical direction Z) of the inversion channels that may be induced in the active mesas 18, e.g., in a vertical projection of the source regions 101.

The possible effect described in the preceding paragraph has also been elucidated in greater detail above, namely with respect to the first share of the total volume of the active mesas 18 that does not laterally overlap with the barrier region 105 and the second share of the total volume of the active mesas 18 that does laterally overlap with the barrier region 105.

In an embodiment, the one or more passages 1053 are positioned and/or dimensioned so as to laterally overlap with at least a subset of the source regions 101.

For example, the barrier region 105 may form a "carpet" arranged within the active cell field 1-2 and, e.g., substantially in parallel to each of the first load terminal 11 and the second load terminal 12 and separated from each of these terminals 11, 12 by means of at least the drift region 100. Such carpet like configuration of the barrier region 105 may be positioned within the semiconductor body 10 such that the trench bottoms 145 and 155 and/or 165 may plunge into the barrier region 105.

The passages 1053 may laterally overlap with one or more of the active mesas 18. Adhering to the visual vocabulary introduced above, the barrier region 105 may hence be implemented as a "patchwork carpet", wherein the one or more passages 1053 can be entirely filled with sections of the drift region 100. The dimensions, the positions and the numbers of passages 1053 can, for example, be chosen in accordance with the cell configuration.

The barrier region 105 may be implemented as a contiguous barrier layer within the active cell field 1-2 of the power semiconductor device 1, e.g., as said "carpet". As has been indicated above, each of the dummy trench bottoms 155 and/or the control trench bottoms 145 and or the source trench bottoms 165 may extend into the barrier region 105, e.g., the dummy trench 15 and/or the control trench 14 and/or the source trench 16 may extend into the barrier region 105 by at least 100 nm, by at least 500 nm or by at least 1000 nm.

Figure 7:
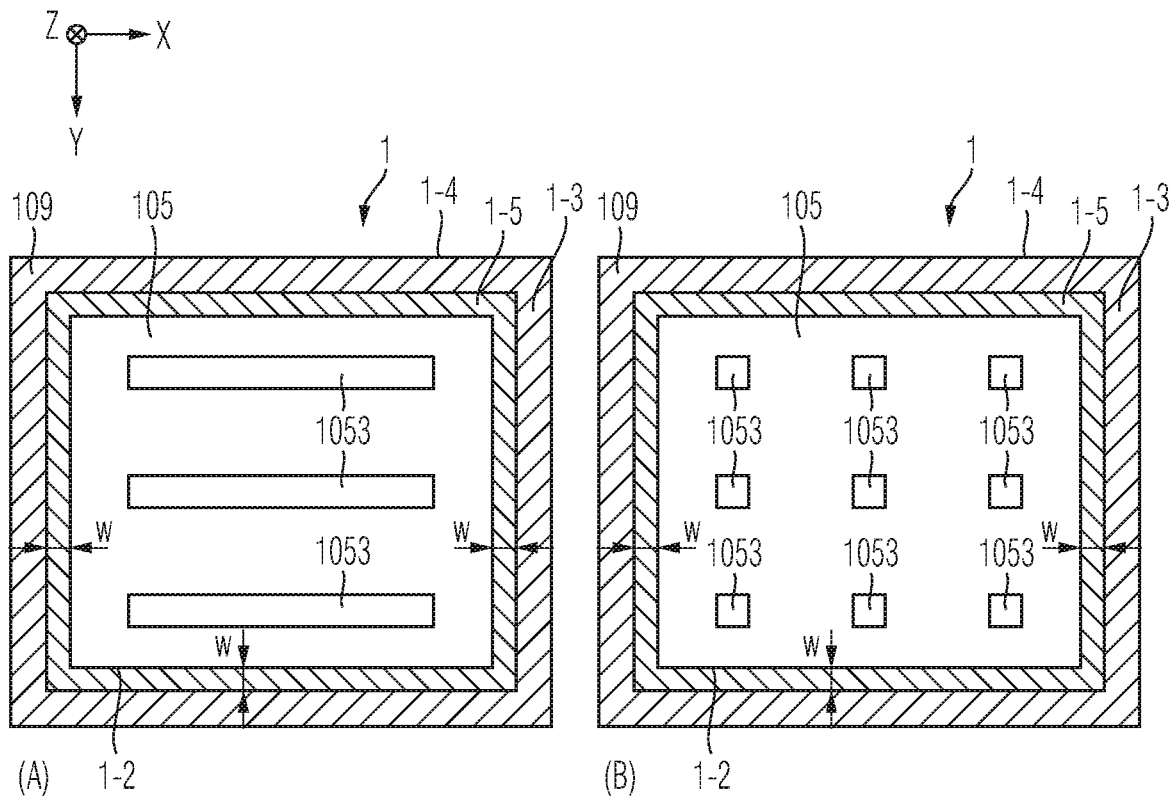
FIGS. 7 and 8A-8D each schematically and exemplarily illustrate a section of a horizontal projection of a power semiconductor device in accordance with one or more embodiments.
Figure 7:
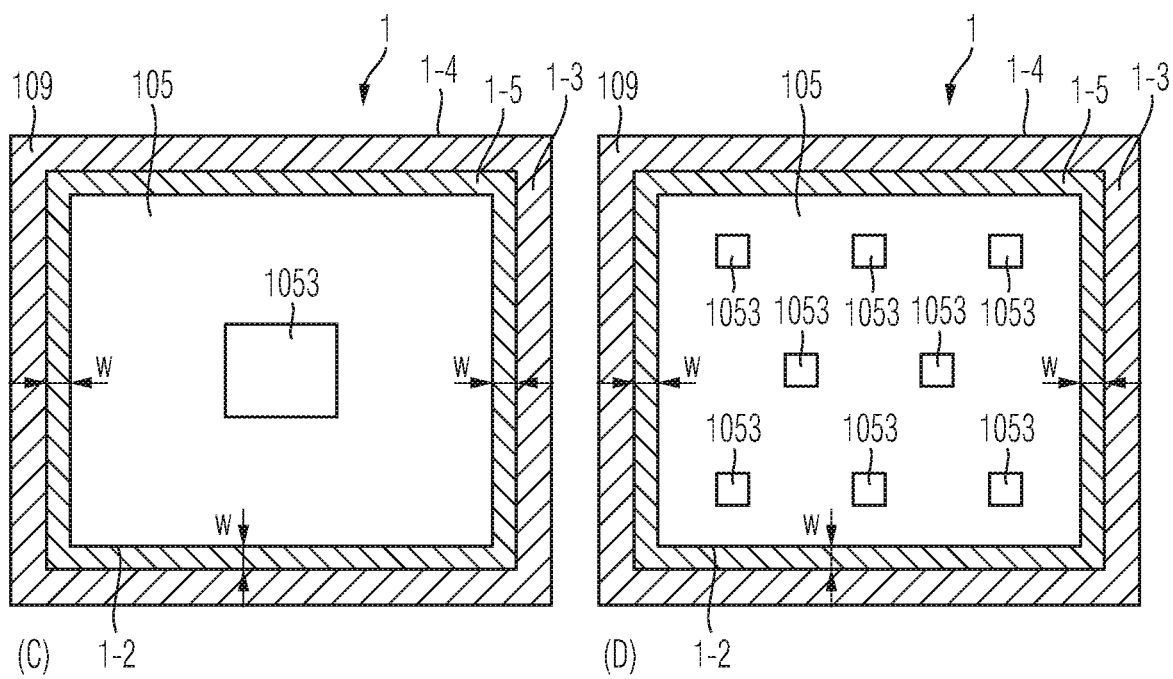

Still referring to FIG. 7, for example, in accordance with variant A, the passages can have a stripe configuration arranged substantially perpendicular to the stripe configuration of the IGBT cells 1-1. In another embodiment, a central pass-through passage 1053 of large extensions is provided (variant B). In accordance with variants B and D, a plurality of smaller the passages 1053 is provided, which can be distributed according to various patterns.

Each of the plurality of passages 1053 can be filled by a section of the drift region 100. Thus, within the passages 1053, an n-doped semiconductor region may be present which exhibits a dopant concentration corresponding to the dopant concentration of the drift region. In another embodiment, which will be elucidated in more detail further below, some or all of the passages 1053 can also be filled by means of (deeper) trenches.

Some embodiments are provided with a barrier region 105 whose pass-through passages 1053 are positioned and dimensioned according to a predefined design rule. For example, said second layout can be configured in accordance with the design rule. The positions and dimensions of the passages 1053 may have significant influence on the dynamic behavior of the power semiconductor device 1, e.g., regarding a voltage slope (dV/dt) during a turn-on operation.

For example, in accordance with a first provision of such design rule, a distance between two arbitrary ones of the pass-through passages 1053 that are arranged adjacent to each other is smaller than 1 mm.

A second provision of such design rule can be that the barrier region 105 is arranged within a semiconductor layer of the semiconductor body 10, the semiconductor layer extending entirely and exclusively within the active cell region 1-2 and exhibiting a total volume, wherein the pass-through passages 1053 form at least 1% and at most 50% of said total volume. The remaining volume of the semiconductor layer, i.e., the p-doped part of the barrier region 105, can be formed by semiconductor regions of the second conductivity type. As already indicated above, i.e., the remaining volume, can have a dopant concentration (cf. concentration CC in FIG. 5) greater than 1e14 cm$^{-3}$ and smaller than 4e17 cm$^{-3}$, said dopant concentration being present within an extension along the vertical direction Z of at least 0.1 µm or at least 0.5 µm.

A third provision of such design rule can be, that the barrier region 105, despite its passages 1053, connects the inactive mesas 19 included in the plurality of IGBT cells 1-1 of the active cell region 1-2 with each other.

A fourth provision of such design rule can be that the passages 1053 laterally overlap with at least a subset of the active mesas 18 of the active cell region 1-2. For example, the one or more passages 1053 are positioned and/or dimensioned so as to laterally overlap with at least a subset of the source regions 101.

The fifth provision of such design rule can be that the passages 1053 laterally overlap with at least a subset of the control trenches 14 of the active cell region 1-2.

A further provision of such design rule can be that the barrier region 105 extends at least partially into subset of the active mesas 18, e.g., without establishing contact with the respective control trench 14 that is laterally flanked by the respective active mesa 18. For example, thereby, the barrier region 105 can be configured to provide for an electrically conductive path between a section of a respective one of the subset of the active mesas 18 and the bottoms 155 of the dummy trenches 15. Hence, it can be provision of the design rule that the pass-through passages 1053 laterally overlap with one or more of the active mesas 18 of the IGBT cells 1-1. For example, the design rule can specify that the pass-through passages 1053 laterally overlap, with respect to the total number of active mesas 18 present within the active cell region 1-2, with at least 1% and at most 50% of the active mesas 18. As explained above, the lateral overlap between the barrier region 105 and a respective one of the active mesas 18 may occur partially; i.e., the barrier region 105 must not necessarily entirely overlap with the respective active mesa 18, but, e.g., up to 10%, up to 30% or up to 70% of the mesa width of the respective active mesa 18.

With respect to FIGS. 8A-D, which each schematically and exemplarily illustrate a section of a horizontal projection of a power semiconductor device 1 in accordance with some embodiments, exemplary lateral structures of the barrier region 105 shall be presented.

Referring to each of FIGS. 8A-D, the barrier region 105 may extend entirely and exclusively within the active cell region 1-2. Within the active cell region 1-2, said plurality of IGBT cells 1-1 may be provided, each of which comprises at least one of said control trenches 14 that may be laterally flanked, on each side, by a respective active mesa 18, each of which comprises the source region 101 that is electrically connected to the first load terminal 11. The IGBT cells 1-1 that are included in the active region 1-2 may exhibit a configuration as has been explained with respect to FIGS. 6A-C. The IGBT cells 1-1 exhibit a stripe configuration substantially orientated along the second lateral direction Y, as has also been explained above. For example, each IGBT cell 1-1 extends along the second lateral direction throughout the entire active cell region 1-2.

In FIGS. 8A-D, a plurality of source regions 101 is illustrated, wherein only some are provided with a respective reference sign. For example, each of the illustrated source regions 101 forms a part of two active mesas 18, in between which there is arranged a respective control trench 14, as illustrated in FIG. 6A.

The active cell region 1-2 can be entirely surrounded by the transition region 1-5, which in turn can be entirely surrounded by the edge termination region 1-3. The transition region 1-5 and the edge termination region 1-3 may be configured in a manner as has exemplarily been explained with respect to FIGS. 6A-C.

As illustrated in FIGS. 8A-D, the lateral structure of the barrier region 105, which is formed or, respectively defined by the number, dimensions and positions of the passages 1053, can exhibit a significantly greater pitch as compared to the pitch according to which the layout of the trench pattern is formed.

Figure 8A:
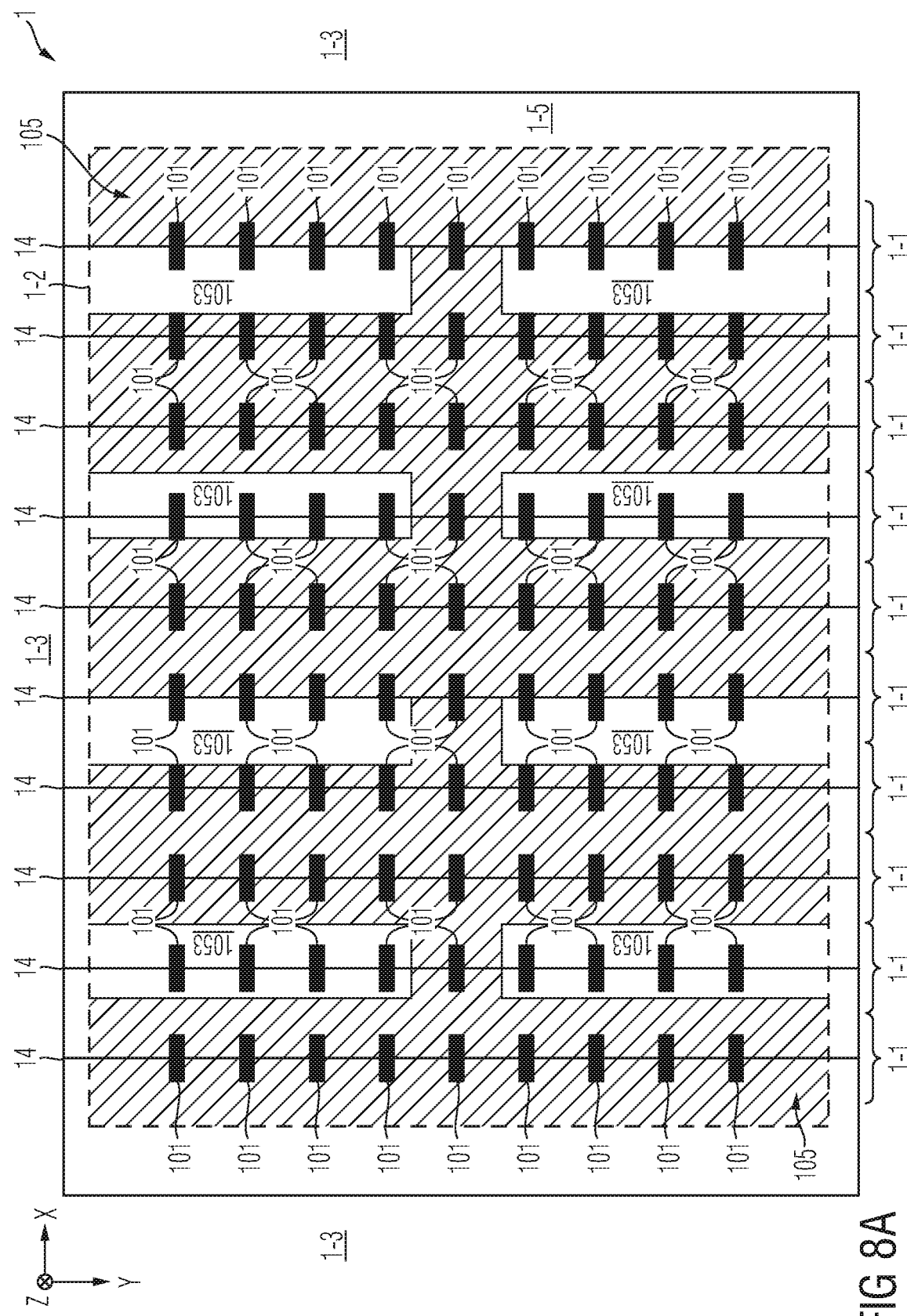

For example, referring to FIG. 8A, the passages 1053 may exhibit an orientation substantially in parallel to the orientation of the stripe configuration of the IGBT cells 1-1. A respective one of the passages 1053 may laterally overlap with a plurality of adjacent trenches and mesas. It has been pointed out above that it may be appropriate to position the passages 1053 such that they laterally overlap with at least a subset of the active mesas 18, which is the case in accordance with the embodiment illustrated in FIG. 8A; there, the position of the passages 1053 is chosen such that the passages 1053 overlap with a subset of the source regions 101. Hence, a load current of said subset of active mesas 18 does not traverse the barrier region 105, but flows through its passages 1053. As further illustrated in FIG. 8A, in accordance with an embodiment, also the passages 1053 may terminate at the transition between the active cell region 1-2 and the transition region 1-5.

Figure 8B:
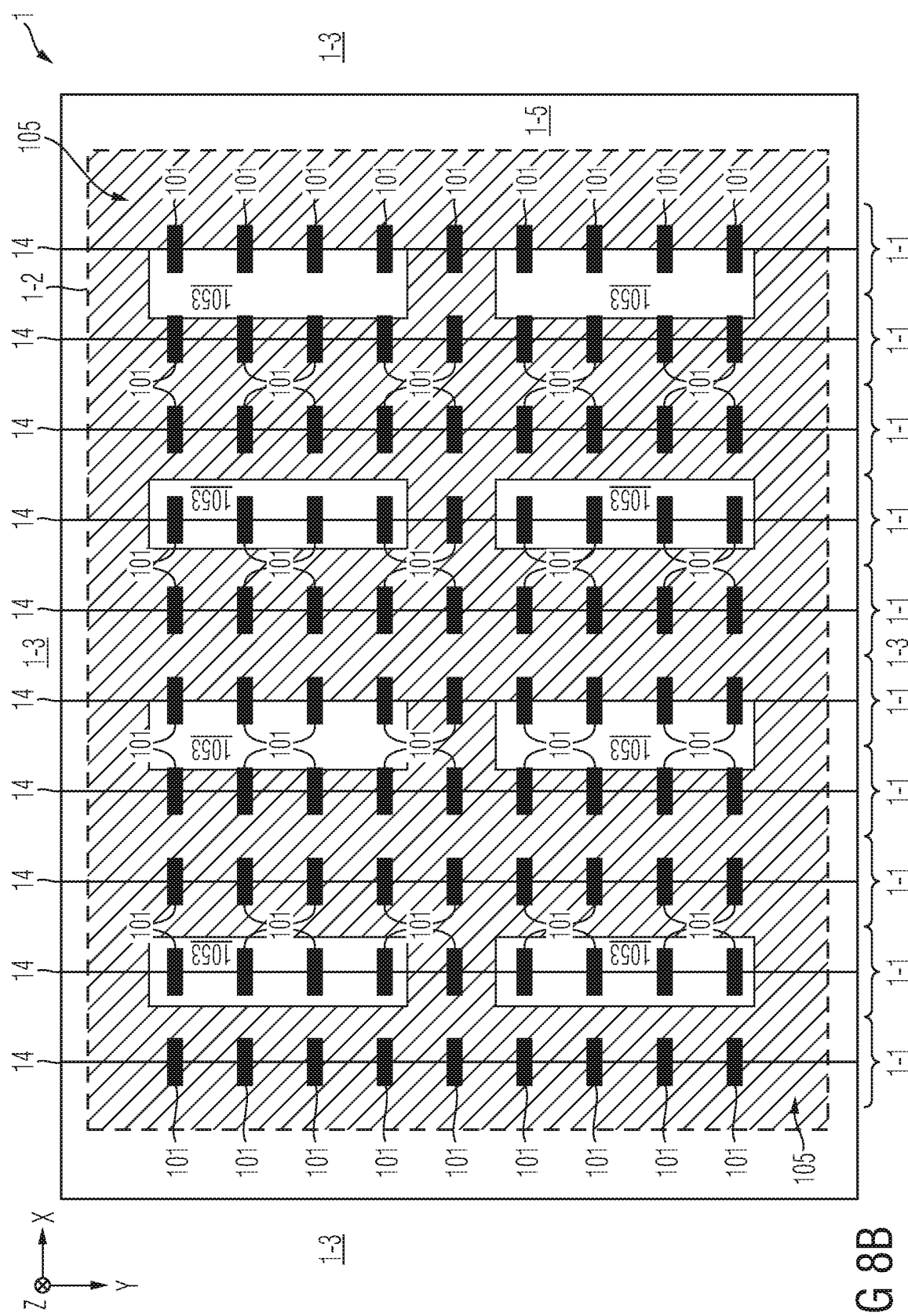

The embodiment illustrated in FIG. 8B essentially corresponds to the embodiment illustrated in FIG. 8A, wherein the passages 1053 are dimensioned and positioned so as to be entirely integrated within the barrier region 105 and so as to not intersect with the transition region 1-5.

Figure 8C:
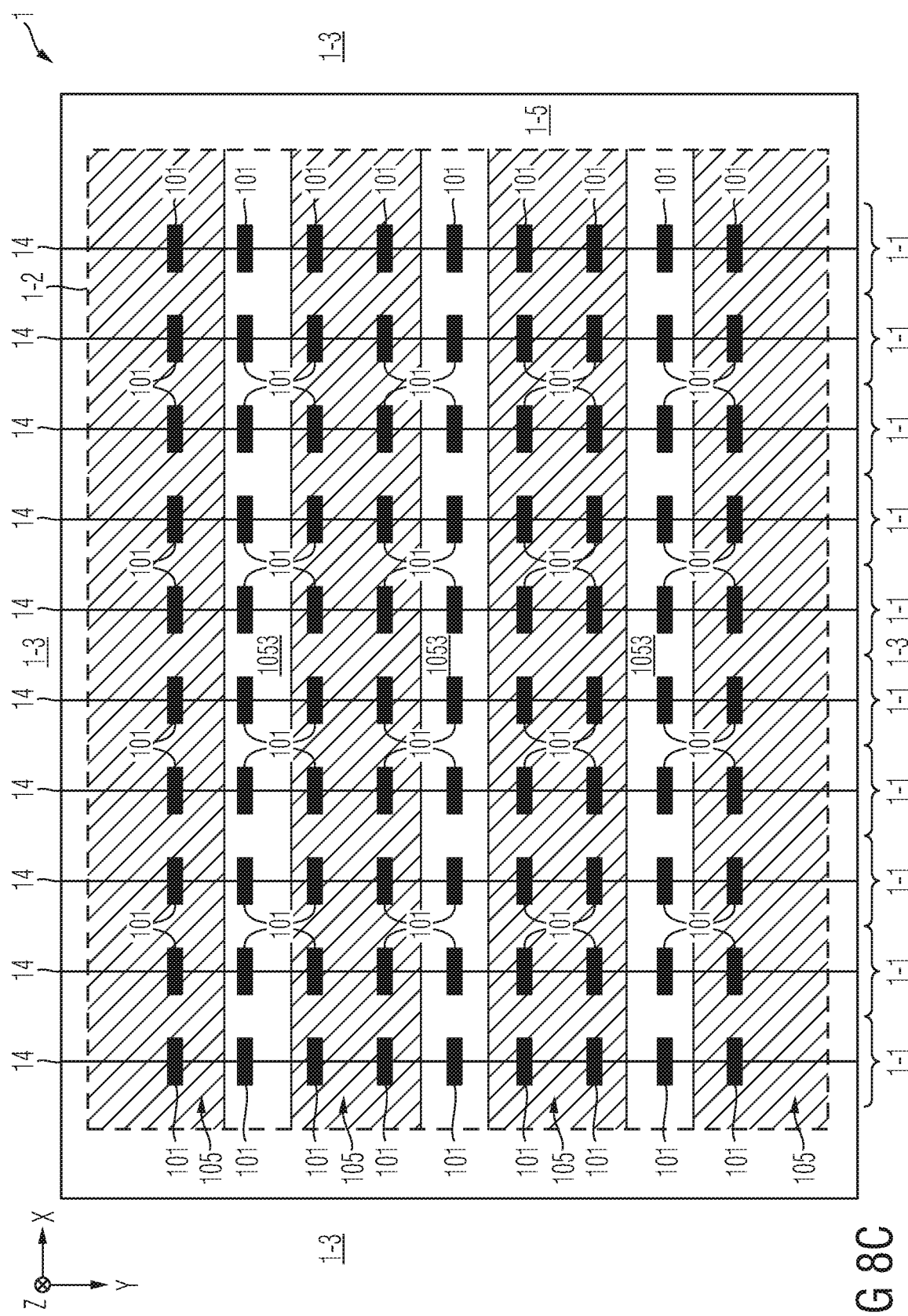
Figure 8D:
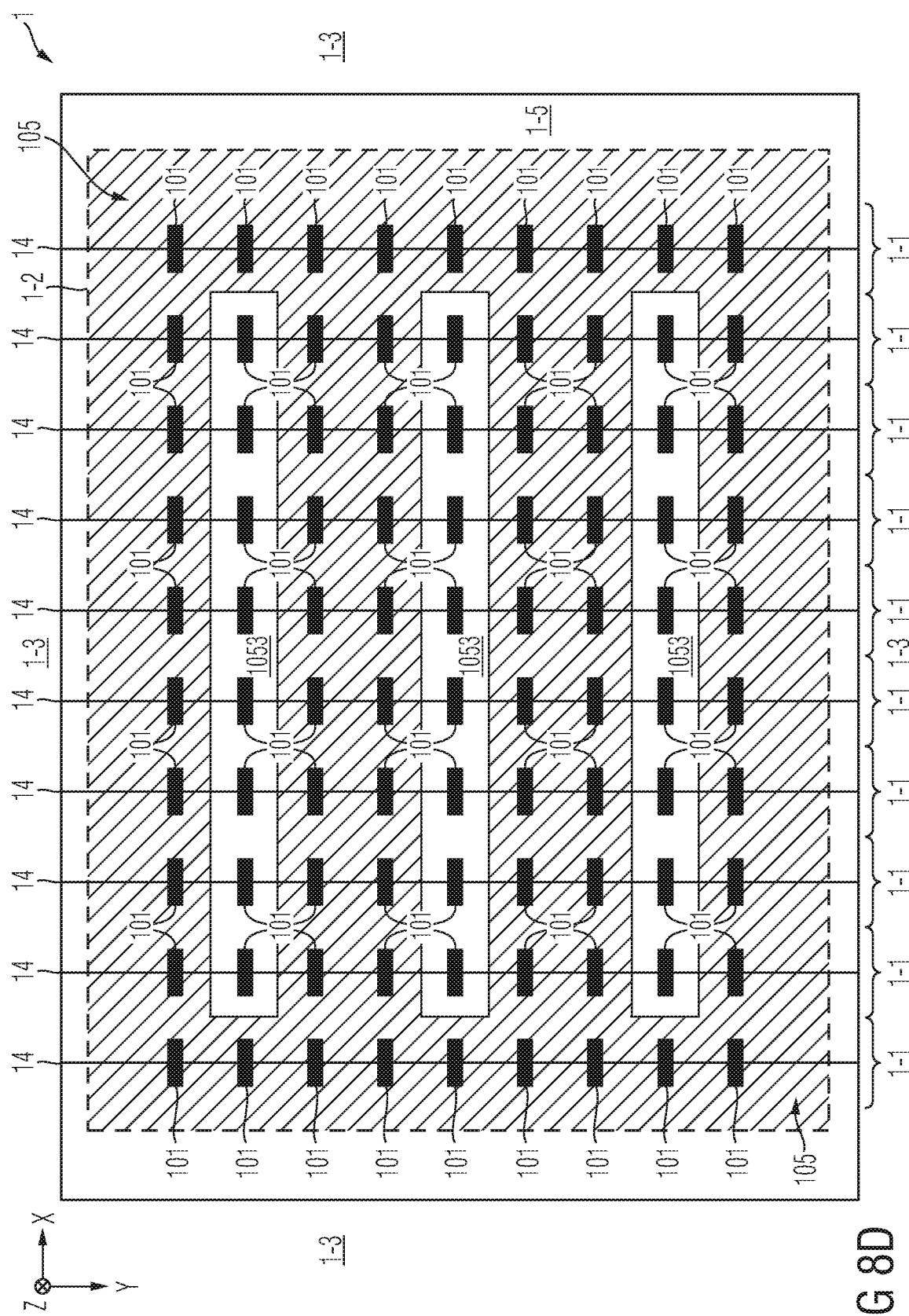
Figure 9:
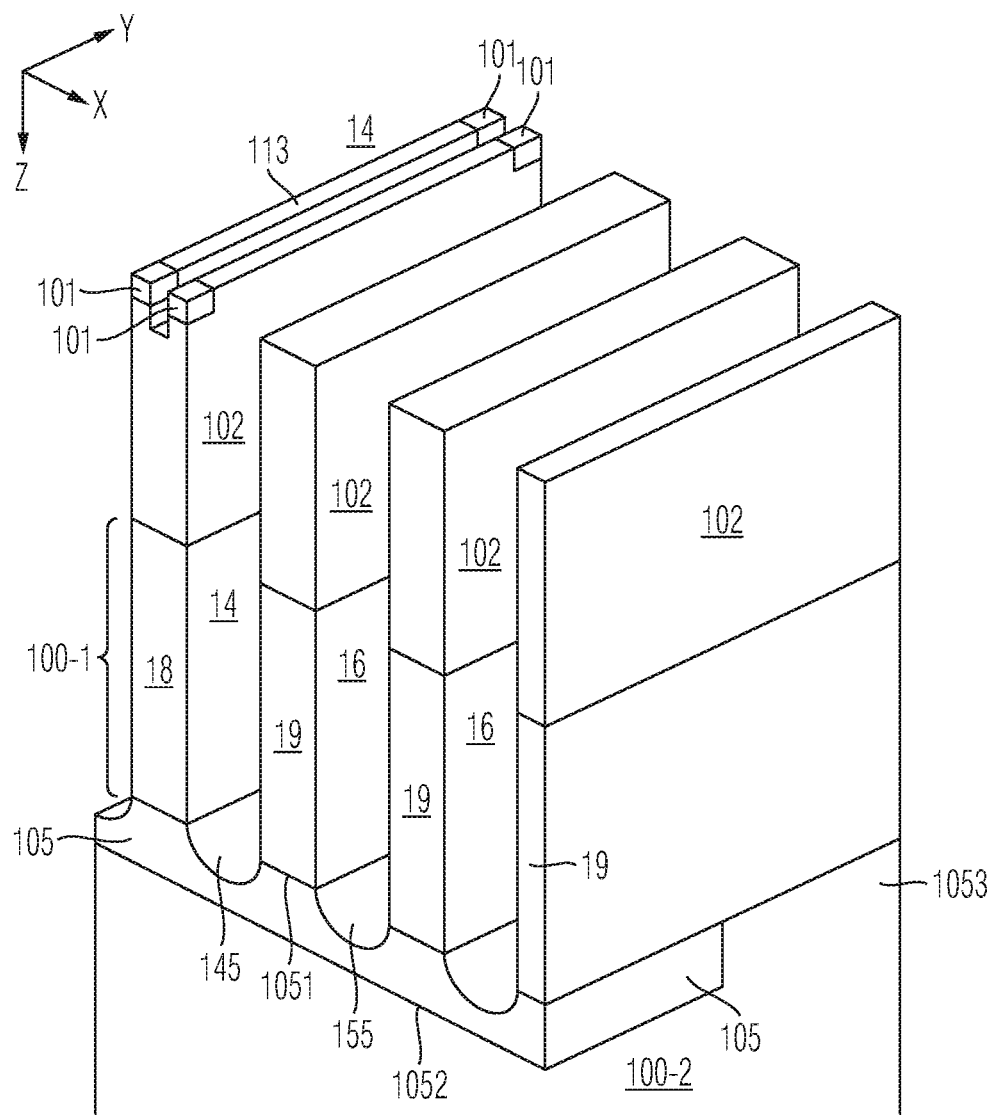
FIG. 9 schematically and exemplarily illustrate a perspective projection of a power semiconductor device in accordance with one or more embodiments.

In accordance with the embodiment schematically and exemplarily illustrated in FIG. 8C, the passages 1053 exhibit an orientation substantially perpendicular to the orientation of the stripe configuration of the IGBT cells 1-1. Such orientation, which is also schematically and exemplarily illustrated in the perspective projection of FIG. 9, may support dampening or, respectively, avoiding of a voltage swing during the switching operation of the power semiconductor device 1. The embodiment illustrated in FIG. 8D essentially corresponds to the embodiment illustrated in FIG. 8C, wherein the passages 1053 are dimensioned and positioned so as to be entirely integrated within the barrier region 105 and so as to not intersect with the transition region 1-5.

Figure 10:
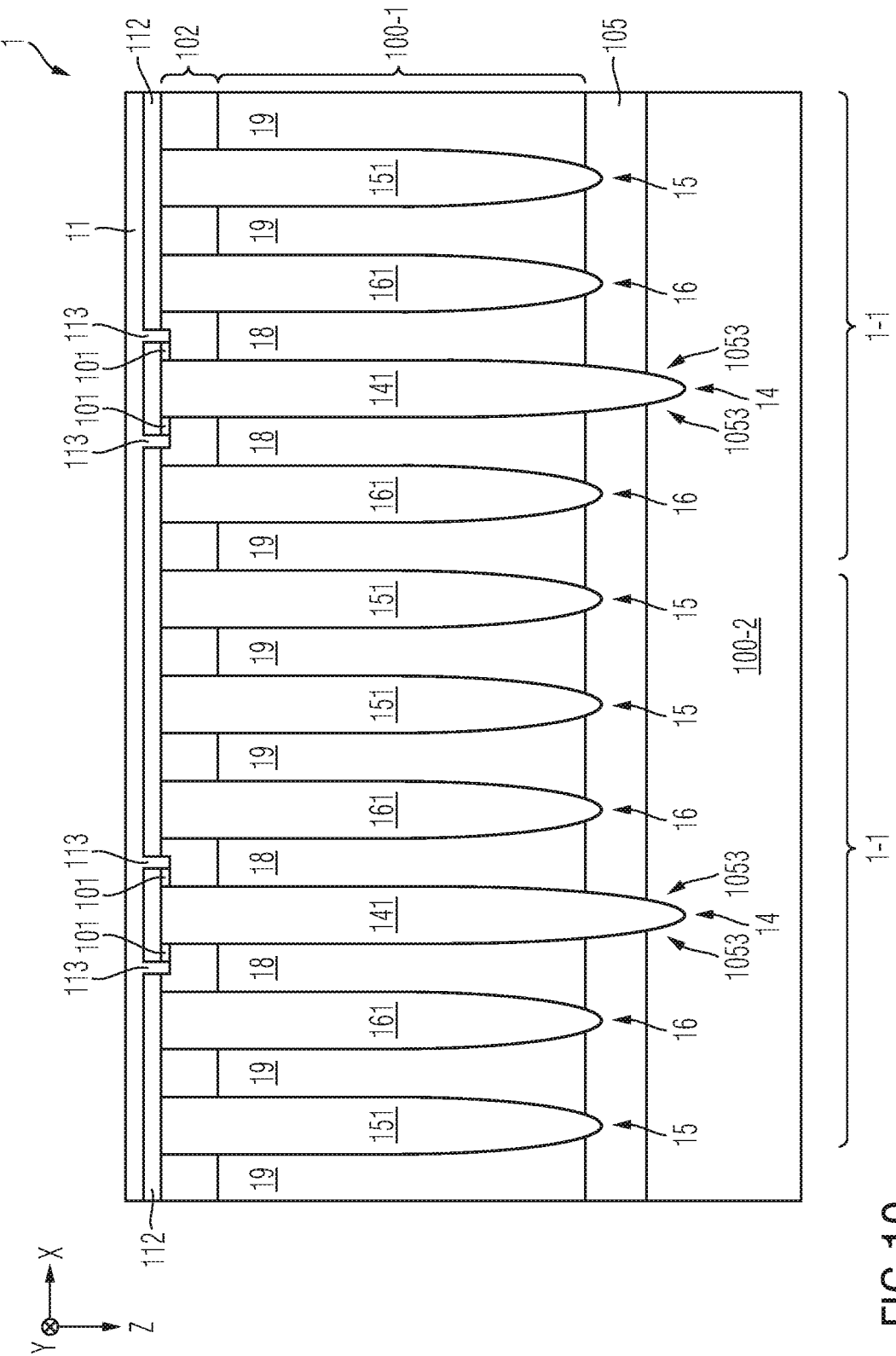
FIGS. 10-11 each schematically and exemplarily illustrate a section of a vertical cross-section of a power semiconductor device in accordance with one or more embodiments.
Figure 11:
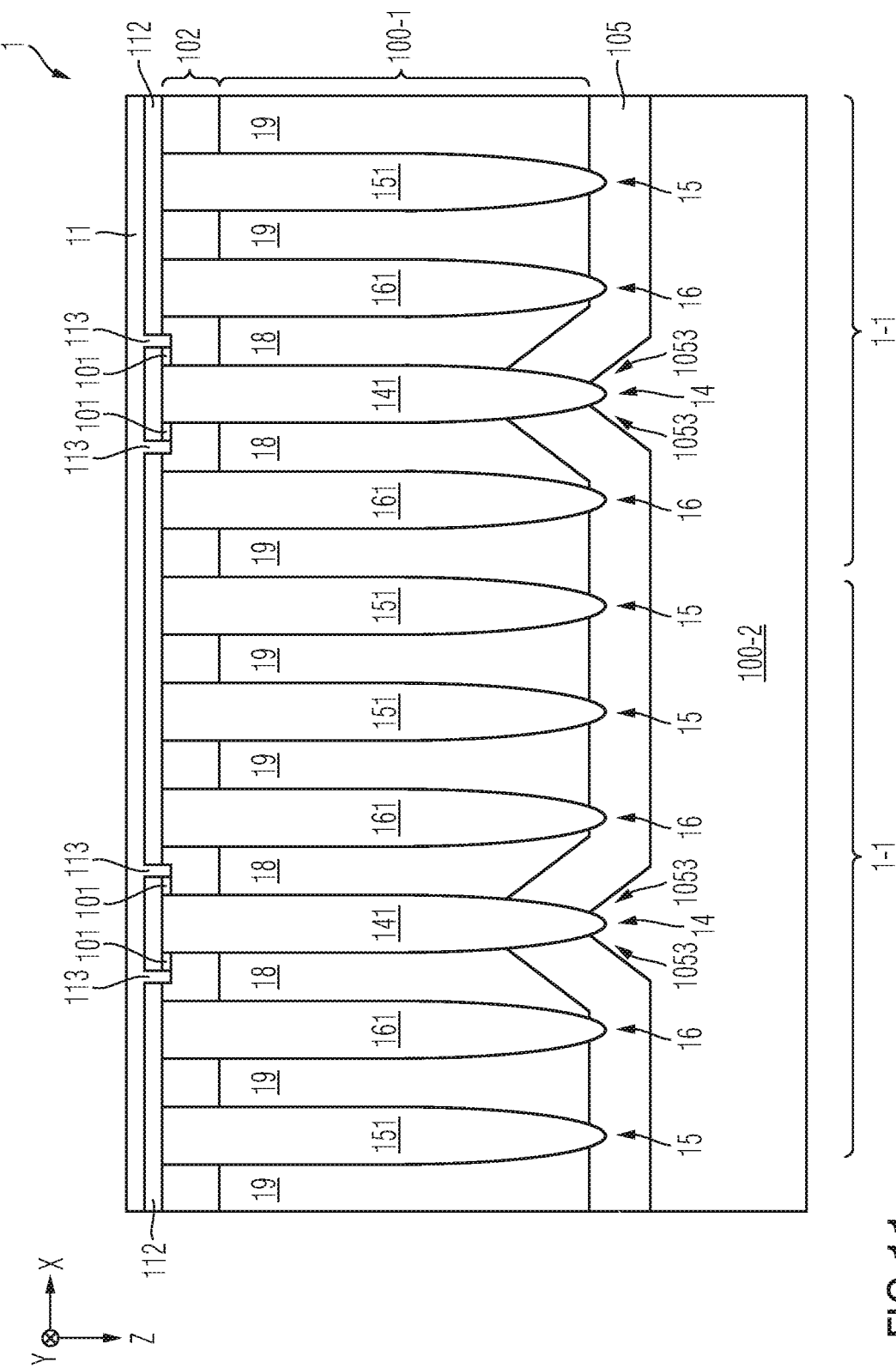

Now referring to the embodiments that are schematically and exemplarily illustrated in FIGS. 10 and 11, some or all of the passages 1053 may also be filled, in addition or in alternative to the drift region 100, with lower sections of trenches of the IGBT cells 1-1. For example, some or all of the passages 1053 are filled with lower sections of the control trenches 14. In accordance with the embodiment illustrated in FIG. 10, this may be achieved by designing the control trenches 14 was a greater total extension along the vertical direction Z as compared to the trenches that do not fill the passages 1053. In accordance with the embodiment illustrated in FIG. 11, this may be achieved by providing the barrier region 105 such that the passages 1053 are arranged within respective local elevations (with respect to the vertical direction Z). Further below, exemplary methods of producing structures as illustrated in FIGS. 10 and 11 will be presented.

As further illustrated in FIGS. 10 and 11, in an embodiment, the contacting scheme is different from the above-mentioned exemplary contacting scheme, for example, the contacting scheme of each IGBT cell 1-1 within the active cell region 1-2 is "oSkGkSoDoD", but also in accordance with this contacting scheme, the active mesas 18 are laterally confined by a respective source trench 16.

Now referring to FIGS. 12 to 19, further exemplary lateral structures of the barrier region 105 shall be presented. In accordance with each of the embodiments schematically and exemplarily illustrated in FIGS. 12 to 19, the contacting scheme for each IGBT cell 1-1 within the active region 1-2 is "oDoSoSkGkSoSoD". However, as noted above, in other embodiment, a different contacting scheme is employed, examples of which have been presented further above.

Figure 12:
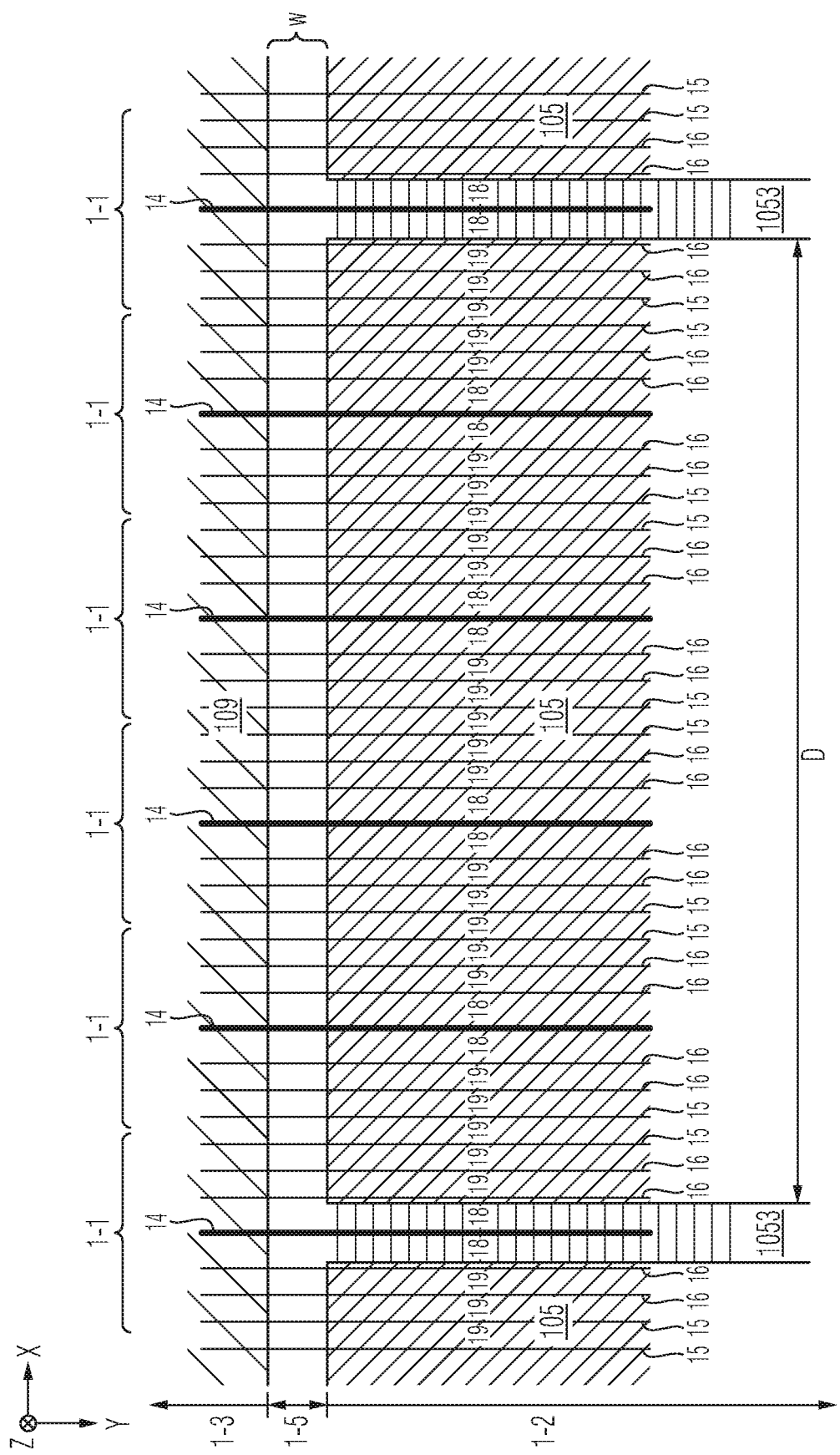
FIGS. 12-19 each schematically and exemplarily illustrate a section of a horizontal projection of a power semiconductor device in accordance with one or more embodiments.

For example, referring to FIG. 12, the passages 1053 extend in parallel to the stripe configuration of the control trench 14. The barrier region 105 partially extends into some of the active mesas 18 that are arranged adjacent to each side of the respective control trench 14. As illustrated, the passages 1053 may occur, along the first lateral direction X, at every fifth IGBT cell 1-1. Hence, a distance D between two neighbored passages 1053 along the first lateral direction X may be greater than 500 µm, e.g., amount to approximately 700 µm. For example, the barrier region 105 hence entirely laterally overlaps with at least always exactly 80% of the total number of IGBT cells 1-1 within the active region 1-2. The remaining 20% of the total number of IGBT cells 1-1 within the active region 1-2 may laterally overlap with the passages 1053, e.g., by means of their respective control trench 14 and their respective active mesas 18, as illustrated in FIG. 12. Further, as also illustrated in FIG. 12, the well region 109 does not extend into the transition 1-5, and the barrier region 105 does also not extend into the transition region 1-5. Rather, the transition region 1-5 separates the barrier region 105 from the well region 109.

Figure 13:
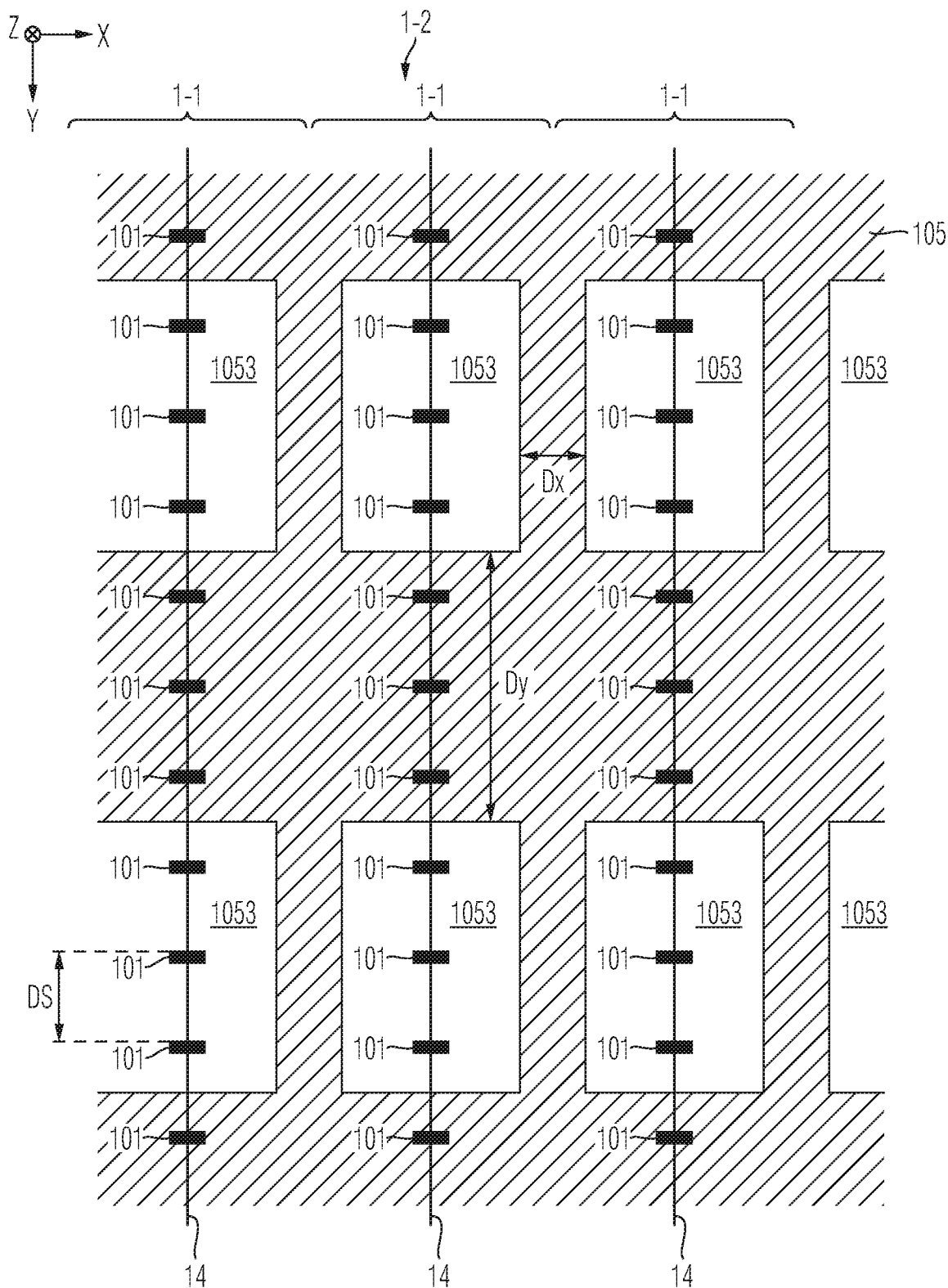

In accordance with the embodiment shown in FIG. 13, the passages 1053 may also each be provided with a smaller rectangular cross-section and positioned in accordance with an island pattern within the active cell region 1-2. Each of the passages 1053 may have a width along the first lateral direction X within the range of 5 µm to 20 µm and the length along the second lateral direction Y within the range of 5 µm to 20 µm.

In an embodiment, for each of the passages 1053, the width along the first lateral direction X is greater than the length along the second lateral direction Y of the respective passages 1053, e.g., the width-to-length ratio of each passage is greater than 2, or even greater than 3. Hence, the passages may have geometric configuration so as to extend rather perpendicular to the stripe configuration of the IGBT cells 1-1 and not in parallel thereto. Such configuration may be beneficial for avoiding/reducing an undesired voltage swing/oscillation on the control electrodes 141.

Along the first lateral direction X, each IGBT cell 1-1 (of which, in FIG. 13, only the source regions 101 and the control trenches 14 are illustrated, wherein each of the illustrated source regions 101 is electrically connected to two respective active mesas 18 that are separated from each other by means of a respective control trench 14) may laterally overlap with one of the passages 1053. Along the second lateral direction Y, each IGBT cell 1-1 may laterally overlap with a plurality of the passages 1053. For example, a distance Dx between two passages 1053 that are neighbored along the first lateral direction X is within the range of some micrometers, e.g., 3 µm to 5 µm. Further, a distance Dy between two passages 1053 that are neighbored along the second lateral direction Y can be within the range of some micrometers, e.g., 5 μm to 20 μm, e.g. approximately 15 μm.

Along the second lateral direction Y, the source regions 101 can be positioned with a distance Ds within the range of 0.1 μm to 20 μm. For example, each passage 1053 laterally overlaps with at least three of the source regions 101 along the second lateral direction Y.

Figure 14:
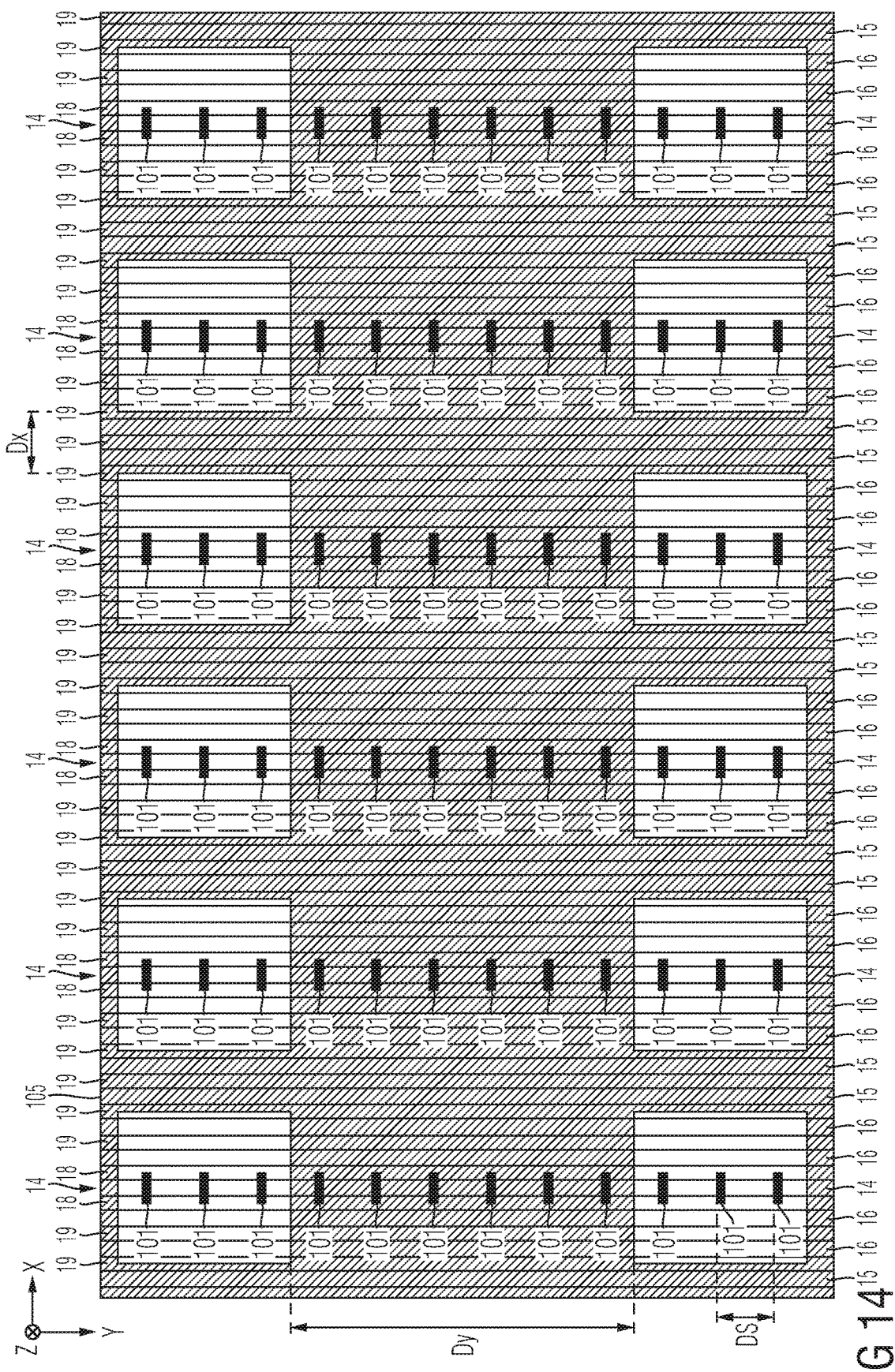

A similar configuration is schematically and exemplarily illustrated in FIG. 14. Along the first lateral direction X, each IGBT cell 1-1 may laterally overlap with one of the passages 1053. Along the second lateral direction Y, each IGBT cell 1-1 may laterally overlap with a plurality of the passages 1053, wherein the distance Dy along the second lateral direction is increased as compared to the embodiment shown in FIG. 13.

For example, the passages 1053 do not laterally overlap with the dummy trenches 15. Rather, each of the dummy trenches 15 extends into the barrier region 105. For example, the passages 1053 overlap partially with the control trenches 14 and the source trenches 16.

Figure 15:
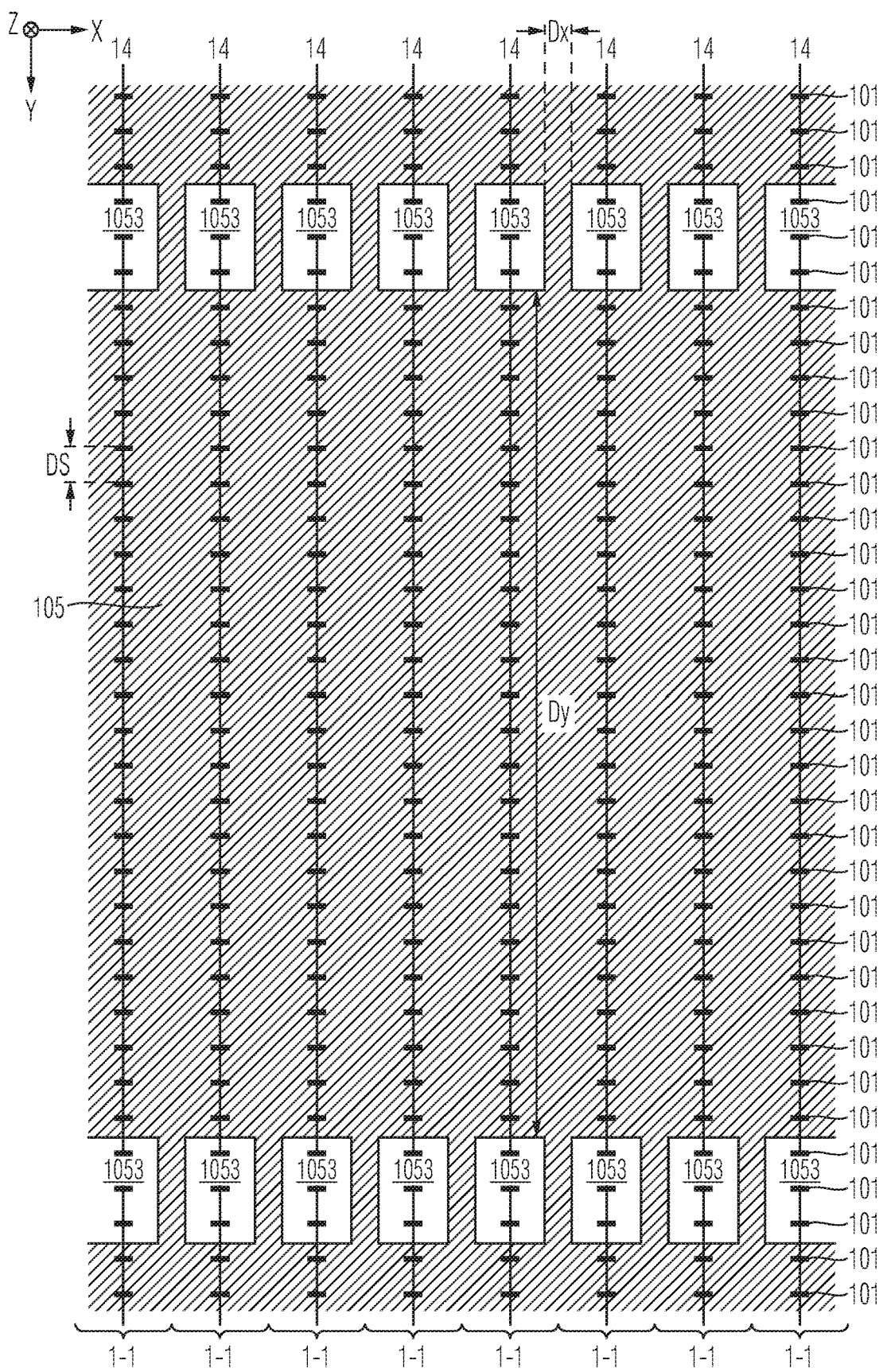

The lateral structure of the barrier region 105 schematically and exemplarily illustrated in FIG. 15 essentially corresponds to the structure as illustrated in each of FIGS. 13 and 14. Accordingly, along the first lateral direction X, each IGBT cell 1-1 may laterally overlap with one of the passages 1053. Along the second lateral direction Y, each IGBT cell 1-1 may laterally overlap with a plurality of the passages 1053, wherein the distance Dy along the second lateral direction is increased as compared to the embodiment shown in FIG. 14. E.g., the distance Dy between two passages 1053 that are neighbored along the second lateral direction amounts is within the range of several micrometers, e.g., 1 μm to 2000 μm.

Figure 16:
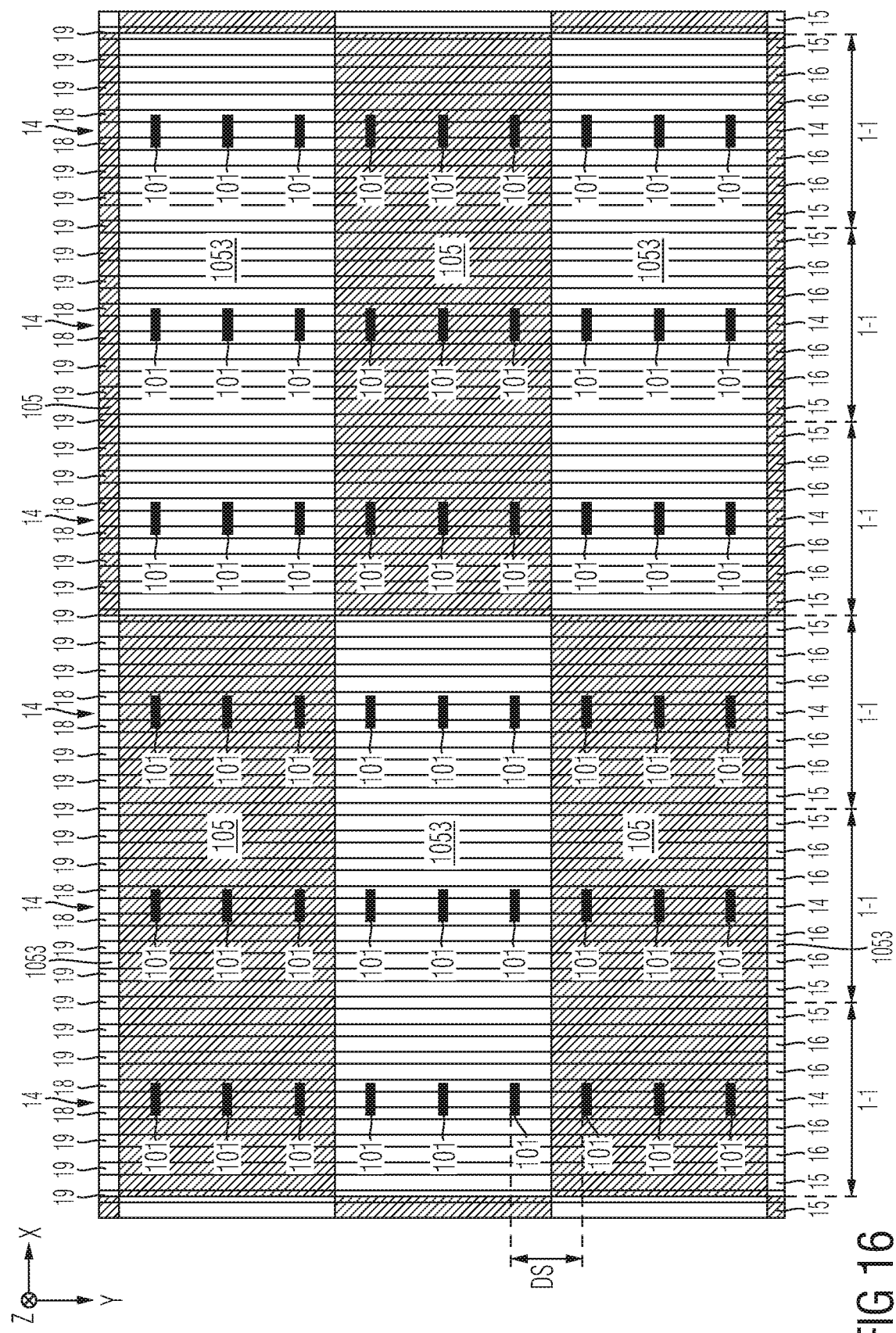

In accordance with variant schematically and exemplarily illustrated in FIG. 16, the lateral structure of the barrier region 105 has a chessboard like pattern. According to the embodiment, about 50% of the total volume of the barrier region 105 is constituted by the passages 1053 (e.g., filled with respective sections of the drift region 100) and the remaining 50% of the barrier region 105 are p-doped regions. For example, each passage 1053 may exhibit a rectangular cross-section. Each of the passages 1053 may have a width along the first lateral direction X so as to overlap with three neighbored IGBT cells 1-1, and a length along the second lateral direction Y so as to overlap with three neighbored source regions 101. Along the second lateral direction Y, the source regions 101 can be positioned within a distance Ds within the range given above. As illustrated, in accordance with the embodiment of FIG. 16 and in contrast to the embodiment shown in FIG. 14, the passages 1053 may laterally overlap with the dummy trenches 15.

Figure 17:
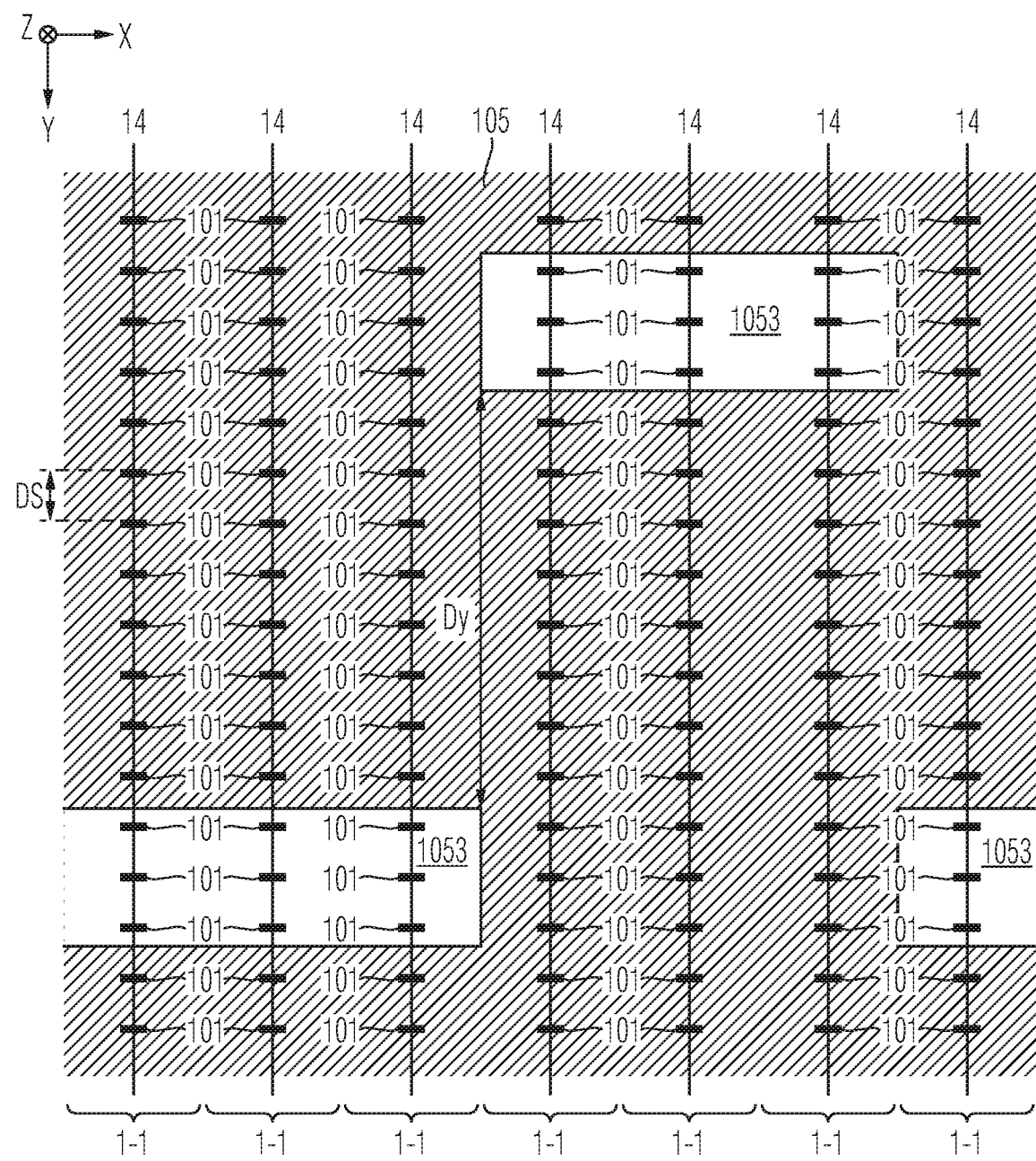

In accordance with the further variant that is schematically and exemplarily illustrated in FIG. 17, compared to the lateral structure shown in FIG. 16, the volume share of the passages 1053 may be decreased from 50% to less than 20%. Each of the passages 1053 may have a width along the first lateral direction X so as to overlap with three neighbored IGBT cells 1-1, and a length along the second lateral direction Y so as to overlap with three neighbored source regions 101. Along the second lateral direction Y, the source regions 101 can be positioned within a distance Ds within the range given above. Again, as illustrated, also in accordance with the embodiment of FIG. 17 and in contrast to the embodiment shown in FIG. 14, the passages 1053 may laterally overlap with the dummy trenches 15. Further, the distance the distance Dx along the first lateral direction X between two neighbored passages 1053 may amount to the total width of three neighbored IGBT cells 1-1. The distance Dy along the second lateral direction Y may be greater than the distance Dx. For example, the distance Dy along the second lateral direction Y between two neighbored passages may amount to at least eight times the distance Ds.

Figure 18:
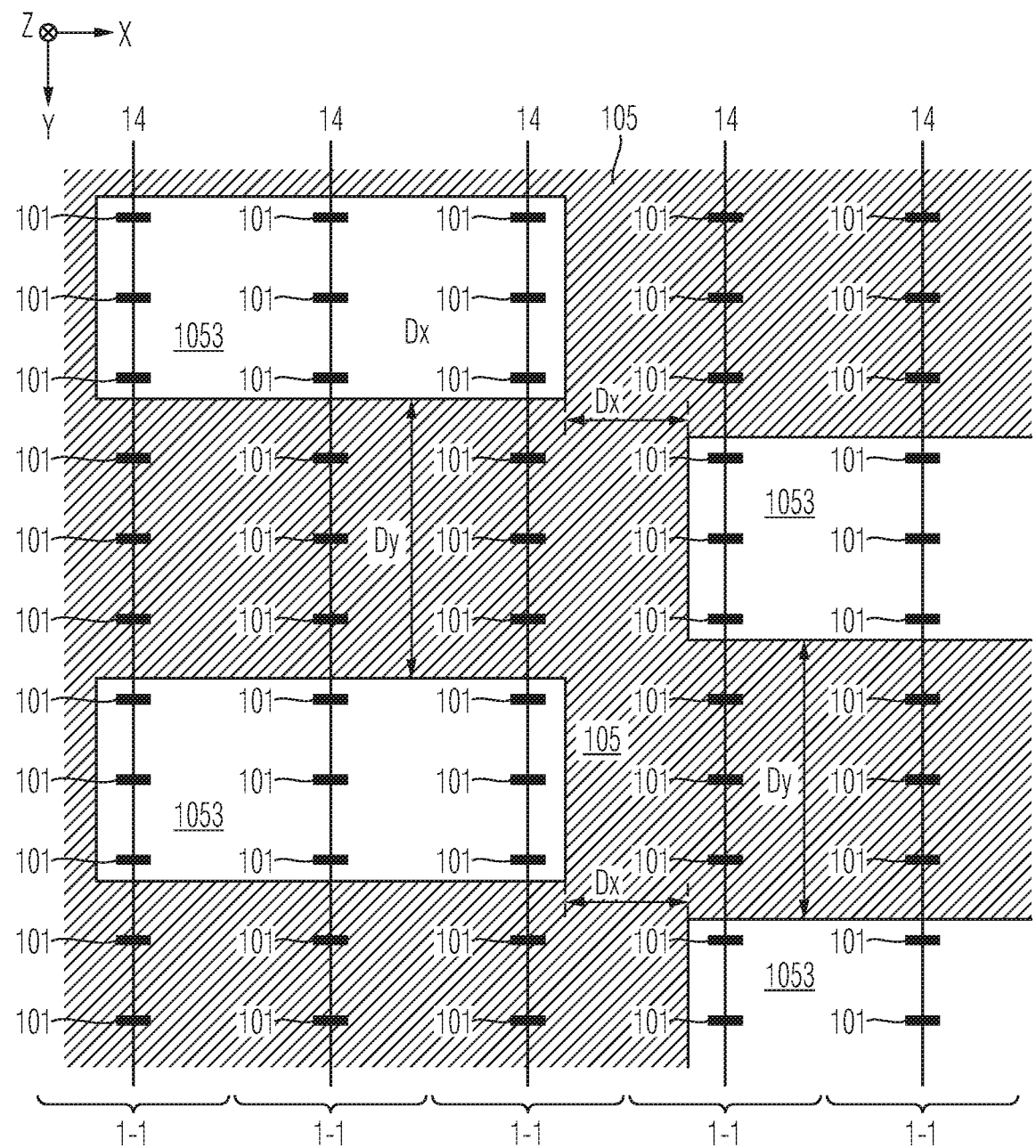

While keeping the dimensions of the passages 1053 unmodified with respect to the embodiment shown in FIG. 17, in accordance with the embodiment schematically and exemplarily illustrated in FIG. 18, the density of the passages 1053 may be increased and, hence, the distances Dx and Dy decreased. As further illustrated in FIGS. 17 and 18, the passages 1053 may be positioned such that two passages 1053 that are neighbored, at distance Dy, along the second lateral direction Y do not exhibit a lateral overlap along the first lateral direction X (as illustrated in FIG. 17) or such that two passages 1053 that are neighbored, at distance Dx, along the first lateral direction X do not exhibit a lateral overlap along the second lateral direction Y (as illustrated in FIG. 18).

Figure 19:
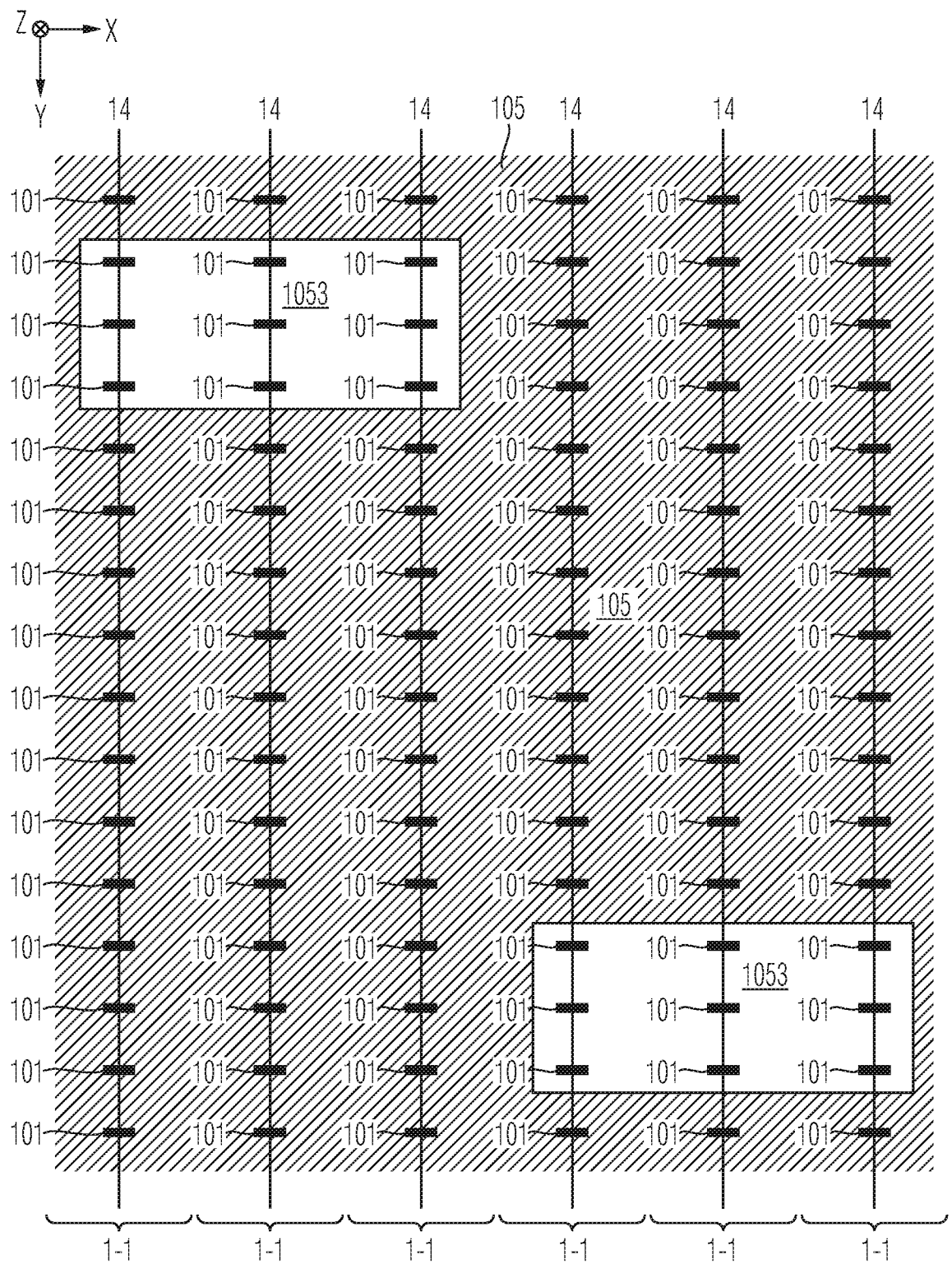

While keeping the dimensions of the passages 1053 unmodified with respect to the embodiment shown in FIG. 17, in accordance with the embodiment schematically and exemplarily illustrated in FIG. 19, the density of the passages 1053 may be decreased and, hence, the distances Dx and Dy increased.

Further variations of the lateral structure of the barrier region 105 are possible. For example, each variation of the lateral structure of the barrier region 105, e.g., as they are exemplarily and schematically illustrated in FIGS. 7 to 19, obeys one or more of the following provisions of a design rule:

(i) a distance, e.g., said distances Dx and Dy, between two arbitrary ones of the pass-through passages 1053 that are arranged adjacent to each other is smaller than 1 mm;

(ii) the barrier region 105 is arranged within said semiconductor layer of the semiconductor body 10, the semiconductor layer extending entirely and exclusively within the active cell region 1-2 and exhibiting a total volume, wherein the pass-through passages 1053 form at least 1% and at most 50% of said total volume. The remaining volume of the semiconductor layer, i.e., the p-doped part of the barrier region 105, is formed by semiconductor regions of the second conductivity type;

(iii) the barrier region 105, despite its passages 1053, connects the inactive mesas 19 included in the plurality of IGBT cells 1-1 of the active cell region 1-2 with each other;

(iv) the passages 1053 laterally overlap with at least a subset of the active mesas 18 of the active cell region 1-2 (For example, the one or more passages 1053 are positioned and/or dimensioned so as to laterally overlap with at least a subset of the source regions 101);

(v) the passages 1053 laterally overlap with at least a subset of the control trenches 14 of the active cell region 1-2;

(vi) the barrier region 105 extends entirely and exclusively within the active cell region 1-2 (and not into the transition region 1-5)

(vii) the barrier region 105 extends at least partially into subset of the active mesas 18 (e.g., without establishing contact with the respective control trench 14 that is laterally flanked by the respective active mesa 18). For example, thereby, the barrier region 105 can be configured to provide for an electrically conductive path between a section of a respective one of the subset of the active mesas 18 and the bottoms 155 of the dummy trenches 15.

(viii) the lateral structure of the barrier region 105 is configured according to the second layout that has the second pitch which is at least twice as large as the first pitch (the IGBT cells 1-1 are configured with a lateral structure according to the first layout having the first pitch, as indicated above).

(ix) if present (e.g., when the power semiconductor device 1 is configured as an RC-IGBT), the passages 1053 may laterally overlap with n-type emitters electrically connected to the second load terminal 12

As has been explained above, the position and/or the lateral structure of the barrier region 105 (e.g., formed by one or more passages as illustrated in FIGS. 7-19) may allow diving the total volume of the active mesas 18 into the first share and into the second share, the first share not laterally overlapping with the barrier region 105 and the second share laterally overlapping with the barrier region 105. As explained above, the first share of the active mesas 18 laterally overlaps with the at least one passage 1053 of the barrier region 105 or with another section of the drift region 100 where the barrier region 105 is not present (e.g., within the transition region 1-5). In contrast, the second share of the active mesas 18 laterally overlaps with the barrier region 105. For example, the load current conducted by the second share traverses the barrier region 105. As has further been explained above, in an embodiment, the first share is configured to carry the load current at least within the range of 0% to 100% of the nominal load current for which the power semiconductor device is designed. The second share may be configured to carry the load current only if it exceeds at least 0.5% of the nominal load current. Hence, the first share of active mesas 18 can be considered as an "ignition volume" which, e.g., during turn-on of the power semiconductor device 1 starts to conduct the load current whereas the second share initially remains inactive. Then, if the load current exceeds the threshold of at least 0.5% of the nominal load current (wherein this threshold can be higher than 0.5%, e.g., higher than 1%, e.g., at least 5% or at least 10%), the barrier region 105 may become more conductive such that the second share may also carry the load current.

Figure 20:
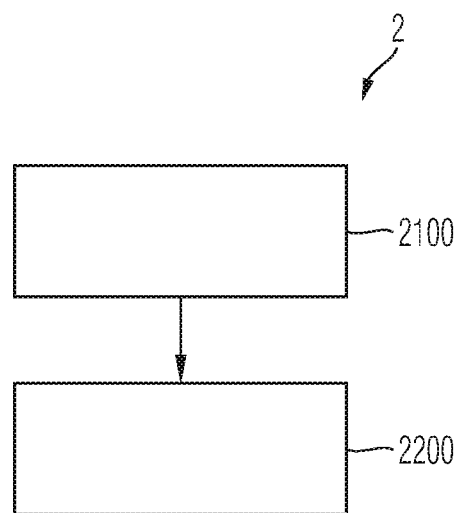
FIG. 20 schematically and exemplarily illustrates steps of a method of processing a power semiconductor device in accordance with one or more embodiments.

Herein presented is also a method of processing a power semiconductor device. A flow chart of an exemplary method 2 is schematically illustrated in FIG. 20. For example, in the first step 2100, a semiconductor body is provided.

The method 2 can be implemented so as to provide a power semiconductor device that comprises an active cell region with a drift region of the first conductivity type; a plurality of IGBT cells at least partially arranged within the active cell region, wherein each of the IGBT cells comprises at least one trench that extends into the drift region along a vertical direction; an edge termination region surrounding the active cell region; and a transition region arranged between the active cell region and the edge termination region, the transition region having a width along a lateral direction from the active cell region towards the edge termination region, wherein at least some of the IGBT cells are arranged within, or, respectively, extend into the transition region.

For example, method 2 may further comprise step 2200, during which an electrically floating barrier region of the second conductivity type is provided, wherein the electrically floating barrier region is arranged within the active cell region and in contact with at least some of the trenches of the IGBT cells, and wherein the electrically floating barrier region does not extend into the transition region.

According to another embodiment, method 2 is implemented so as to provide a power semiconductor device that comprises a first load terminal and a second load terminal, the power semiconductor device being configured to conduct a load current along the vertical direction between said terminals and comprising: an active cell region with a drift region of the first conductivity type; an edge termination region having a well region of the second conductivity type; a plurality of IGBT cells arranged within the active cell region, wherein each of the IGBT cells comprises a plurality of trenches that extend into the drift region along the vertical direction and that laterally confine a plurality of mesas. The plurality of trenches include: at least one control trench having a control electrode; at least one dummy trench having a dummy electrode electrically coupled to the control trench; at least one source trench having a source electrode electrically connected with the first load terminal. The plurality of mesas include at least one active mesa arranged between the at least one control trench and the at least one source trench; and at least one inactive mesa arranged adjacent to the at least one dummy trench. Step 2200 may be carried out so as by providing an electrically floating barrier region of the second conductivity type, wherein at least both a bottom of the dummy trench and a bottom of the source trench extend at least partially into the electrically floating barrier region, and wherein a portion of the drift region located in a lateral direction between the electrically floating barrier region and the well region has a lateral extension of at least 1 µm in said lateral direction.

For example, regarding both embodiments of method 2 described above, the barrier region can be formed before forming the trenches of the IGBT cells. In another embodiment, the barrier region is formed after the trenches of the IGBT cells have been formed. In a yet further embodiment, the barrier region is formed during formation of the IGBT cells, e.g. after the trenches have been etched and before the trenches are filled with trench electrodes.

Exemplary embodiments of the method 2 can correspond to the exemplary embodiments of the power semiconductor device 1 explained above. In particular, method 2 can be carried out so as to form the barrier region with a lateral structure, examples of which have been presented above, e.g., with respect to FIGS. 7 to 19.

In an embodiment of method 2, the lateral structure of the barrier region 105 is formed by creating a homogenously doped p-layer and by locally providing an n-type counter-doping so as to form the passages 1053.

In another embodiment of method 2, the lateral structure of the barrier region 105 is formed by creating a homogenously doped p-layer and pinching through the layer by means of trench depth variation (cf. FIG. 10), e.g., at least partially to a depth beyond the maximum dopant concentration (cf. CCM in FIG. 5).

In yet another embodiment that the lateral structure of the barrier region 105 is formed by using a mask arrangement.

For example, the barrier region 105 is fabricated by means of a deep implantation, e.g., after the formation of the trenches by means of providing the trench insulators 142, 152, 162, 172 and the polysilicon filling for forming the trench electrodes 141, 151, 161, 171. Then, achievement of the projected range (e.g. 5 µm, depending on the trench depth, as explained above) of the barrier region 105 could require high implantation energies, e.g., in the range of 4 MeV, e.g., in case of boron as the implantation material. For example, masking of the implantation can be simplified by the presence of a flat surface, following the polysilicon filling of the trenches. The implantation can occur at high energy, but the dose can be low. Therefore, the trench insulators 142, 152, 162, 172 are not damaged.

In an alternative embodiment, the barrier region 105 is created before the trench fabrication process. For example, this can be carried out by implementing a local shallow p-type implantation followed by an epitaxial growth with a target thickness substantially equal to the trench depth. In this case, slowly diffusing p-type species can be employed as implantation material. For example, such variant can be employed for forming the embodiment in accordance with FIG. 10. The deeper control trenches 14 can be formed, e.g., by tuning the trench layout width and/or by providing separate trench etch blocks for shallow and deeper trenches. Then, the deeper control trenches 14 extend along the vertical direction Z beyond the barrier region 105 and enter the drift region 100, namely its lower section 100-2, as illustrated in FIG. 10. With regards to the embodiment illustrated in FIG. 11, the local elevations of the barrier region 105 can be achieved, e.g., by means of locally providing a counter-doping, e.g., by locally carrying out an n-type implantation. Alternatively, only the p-type implantation is carried out, wherein, implantation dampening elements may be provided at selected positions on the surface of the semiconductor body 10, e.g., at positions where one or more of the designated control trenches 14 are to be formed. Due to the dampening elements, the penetration depth of the implantation ions is decreased, thereby causing the local elevations in the barrier region 105 in the outcome. Then, all trenches 14, 15, 16, 17 may exhibit the same depth, while those which laterally overlap with the local elevations of the barrier region 105 may extend along the vertical direction Z beyond the barrier region 105 and enter the drift region 100, namely its lower section 100-2, as illustrated in FIG. 11. Thereby, the pass-through passages 1053 can be formed, in accordance with an embodiment. For example, the dampening elements are formed by generating local steps on the semiconductor body surface (e.g., by plasma etching or sacrificial recessed LOCOS), wherein this can be followed by a p-type implantation and silicon epitaxial regrowth of proper thickness, so that the trenches will align properly to the p-type implantation profile.

In accordance with one or more embodiments described herein, an IGBT having a plurality of IGBT cells configured in accordance with an MPT structure is presented, wherein each IGBT cell has a control trench for controlling the load current in at least one active mesa and at least one dummy trench with a trench electrode also electrically connected to the control terminal and arranged adjacent to the at least one inactive mesa, wherein the active mesa and the bottom of the dummy trench are connected to each other by means of a laterally structured and electrically floating p-doped barrier region. Due to such connection, during the switching operation of the IGBT, a voltage swing on the control terminal may be reduced, in accordance with an embodiment. This may allow for an improved control of dV/dt by means of a gate signal, e.g., during switching of the IGBT. Furthermore, in an embodiment, the lateral structure of the p-barrier region may avoid a snapback in the transfer and output characteristics of the IGBT. For example, at currents below 10% or even below 1% of nominal load current, the load current is carried by the active mesas not covered by the p-barrier region (e.g., where there is barrier passage). For larger currents, an upper pn-junction formed by a transition between the barrier region and the drift region above the barrier region forward bias mode with respect to the electron current and all active mesas within the active cell region, irrespective of whether they are covered by a p-barrier region or not, carry the load current.

In the above, embodiments pertaining to power semiconductor devices and corresponding processing methods were explained. For example, these power semiconductor device are based on silicon (Si). Accordingly, a monocrystalline semiconductor region or layer, e.g., the semiconductor body 10 and its regions/zones 100, 101, 102, 105, 107, 108, 109 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($SixCl-x$) and silicon-SiGe heterojunction semiconductor materials. For power semiconductor device applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising a first load terminal and a second load terminal, the power semiconductor device being configured to conduct a load current along a vertical direction between the first and second load terminals and comprising:
   an active cell region with a drift region of a first conductivity type;
   an edge termination region having a well region of a second conductivity type;
   a plurality of IGBT cells arranged within the active cell region, wherein each of the IGBT cells comprises a plurality of trenches extending into the drift region along the vertical direction and laterally confining a plurality of mesas;
   the plurality of trenches comprising:
   at least one control trench having a control electrode;
   at least one dummy trench having a dummy electrode electrically coupled to the control electrode;
   at least one source trench having a source electrode electrically connected with the first load terminal;
   the plurality of mesas comprising:
   at least one active mesa arranged between the at least one control trench and the at least one source trench;
   at least one inactive mesa arranged adjacent to the at least one dummy trench;
   an electrically floating barrier region of the second conductivity type, wherein at least both a bottom of the dummy trench and a bottom of the source trench extend at least partially into the electrically floating barrier region, and wherein a portion of the drift region located in a lateral direction between the electrically floating barrier region and the well region has a lateral extension of at least 1 μm in the lateral direction.

2. The power semiconductor device of claim 1, wherein the electrically floating barrier region is spatially confined, in and against the vertical direction, by the drift region.

3. The power semiconductor device of claim 1, wherein the barrier region is formed as a laterally structured layer that extends throughout the entire active cell region.

4. The power semiconductor device of claim 1, wherein the IGBT cells are configured with a lateral structure of the barrier region according to a first layout having a first pitch, and wherein the lateral structure of the barrier region is configured according to a second layout, the second layout having a second pitch at least twice as large as the first pitch.

5. The power semiconductor device of claim 4, wherein the lateral structure of the barrier region is formed by a plurality of pass-through passages.

6. The power semiconductor device of claim 5, wherein each of the plurality of the pass-through passages is filled by either a section of the drift region or by a section of a trench of a respective one of the IGBT cells.

7. The power semiconductor device of claim 5, wherein a distance between two arbitrary ones of the pass-through passages that are arranged adjacent to each other is smaller than 1 mm.

8. The power semiconductor device of claim 5, wherein the barrier region is arranged within a semiconductor layer of the semiconductor body, the semiconductor layer extending entirely and exclusively within the active cell region and having a total volume, wherein the pass-through passages form at least 1% and at most 50% of the total volume, and wherein a remaining volume of the semiconductor layer is formed by semiconductor regions of the second conductivity type.

9. The power semiconductor device of claim 8, wherein the remaining volume has a dopant concentration greater than $1e14$ $cm^{-3}$ and smaller than $1e17$ $cm^{-3}$, the dopant concentration being present within an extension along the vertical direction of at least 0.1 μm.

10. The power semiconductor device of claim 5, wherein the pass-through passages laterally overlap with one or more of the active mesas of the IGBT cells.

11. The power semiconductor device of claim 10, wherein the pass-through passages laterally overlap, with respect to the total number of active mesas present within the active cell region, with at least 1% and at most 50% of the active mesas.

12. The power semiconductor device of claim 1, wherein the barrier region has a resistivity of more than 10 Ωcm and of less than 1000 Ωcm, and/or wherein the barrier region includes boron, aluminum, difluoroboryl, boron trifluoride, or a combination thereof.

13. The power semiconductor device of claim 1, wherein the barrier region is confined, along the vertical direction, by an upper section of the drift region on a first side and by a lower section of the drift region on a second side, and wherein the upper section forms a transition to channel regions of the IGBT cells.

14. The power semiconductor device of claim 13, wherein the dopant concentration within the upper section is at least twice as large as within the lower section.

15. The power semiconductor device of claim 1, wherein the dopant concentration within an upper section of the at least one active mesa is at least twice as large as within a lower section of the at least one active mesa.

16. The power semiconductor device of claim 1, wherein the dopant concentration within an upper section of the at least one active mesa is at least twice as large as within an upper section of the at least one inactive mesa.

* * * * *